(12) United States Patent
Jang et al.

(10) Patent No.: US 11,804,566 B2
(45) Date of Patent: Oct. 31, 2023

(54) LIGHT EMITTING DEVICE

(71) Applicant: Seoul Viosys Co., Ltd., Ansan-si (KR)

(72) Inventors: Jong Min Jang, Ansan-si (KR); Chang Yeon Kim, Ansan-si (KR); Myoung Hak Yang, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 17/960,097

(22) Filed: Oct. 4, 2022

(65) Prior Publication Data

US 2023/0025374 A1  Jan. 26, 2023

Related U.S. Application Data

(63) Continuation of application No. 17/110,368, filed on Dec. 3, 2020, now Pat. No. 11,469,342, which is a
(Continued)

(51) Int. Cl.
*H01L 33/00* (2010.01)
*H01L 27/15* (2006.01)
(Continued)

(52) U.S. Cl.
CPC ........ *H01L 33/0016* (2013.01); *H01L 27/156* (2013.01); *H01L 33/14* (2013.01); *H01L 33/387* (2013.01)

(58) Field of Classification Search
CPC . H01L 33/0016; H01L 27/156; H01L 33/387; H01L 33/14; H01L 25/0753; H01L 33/0093; H01L 25/0756; H01L 33/42
See application file for complete search history.

(56) References Cited

U.S. PATENT DOCUMENTS 11,282,981 B2  3/2022  Kim et al.
11,322,488 B2  5/2022  Chang
(Continued)

FOREIGN PATENT DOCUMENTS

KR       100716645       5/2007
KR       101091048       12/2011
(Continued)

OTHER PUBLICATIONS

US 11,355,482 B2, 06/2022, Chae et al. (withdrawn)
(Continued)

*Primary Examiner* — Victor A Mandala
(74) *Attorney, Agent, or Firm* — H.C. Park & Associates, PLC

(57) ABSTRACT

A light emitting device includes a first light emitting part including a first n-type semiconductor layer, and a first mesa structure including a first active layer, a first p-type semiconductor layer, and a first transparent electrode vertically stacked one over another and exposing a portion of a first surface of the first n-type semiconductor layer, a second light emitting part spaced apart from the first mesa structure, and including a second n-type semiconductor layer, a second active layer, a second p-type semiconductor layer, and a second transparent electrode and exposing a portion of a first surface of the second n-type semiconductor layer, and a first bonding layer on which the first and second light emitting parts are disposed and electrically coupling the first n-type semiconductor layer and the second n-type semiconductor layer to each other.

20 Claims, 35 Drawing Sheets

Related U.S. Application Data continuation of application No. 16/536,627, filed on Aug. 9, 2019, now Pat. No. 10,879,419.

(60) Provisional application No. 62/764,961, filed on Aug. 17, 2018.

(51) Int. Cl.
*H01L 33/38* (2010.01)
*H01L 33/14* (2010.01)

(56) References Cited

U.S. PATENT DOCUMENTS

| | | | |
|---|---|---|---|
| 2004/0079951 A1* | 4/2004 | Horng | H01L 33/46 |
| | | | 257/E33.068 |
| 2006/0255343 A1 | 11/2006 | Ogihara et al. | |
| 2013/0264587 A1* | 10/2013 | Chang | H01L 27/15 |
| | | | 257/E33.012 |
| 2016/0118551 A1 | 4/2016 | Kim et al. | |
| 2016/0284944 A1* | 9/2016 | Narita | H01L 33/0095 |
| 2018/0069150 A1* | 3/2018 | Oh | H01L 33/382 |
| 2018/0114878 A1 | 4/2018 | Danesh et al. | |
| 2019/0019782 A1* | 1/2019 | Park | H01L 25/0753 |
| 2019/0123241 A1* | 4/2019 | Odnoblyudov | H01L 33/382 |
| 2019/0164945 A1 | 5/2019 | Chae et al. | |
| 2019/0165207 A1* | 5/2019 | Kim | H01L 33/44 |
| 2019/0181298 A1* | 6/2019 | Park | H01L 33/20 |
| 2019/0181300 A1* | 6/2019 | Park | H01L 33/387 |
| 2019/0189596 A1 | 6/2019 | Chae et al. | |
| 2019/0198565 A1* | 6/2019 | Lee | G09G 3/2003 |
| 2019/0200429 A1 | 7/2019 | Schubert et al. | |
| 2019/0206927 A1* | 7/2019 | Lee | H01L 25/0753 |
| 2019/0386173 A1 | 12/2019 | Chen et al. | |
| 2020/0058825 A1 | 2/2020 | Jang et al. | |
| 2020/0127173 A1* | 4/2020 | Park | H05B 33/12 |
| 2020/0235161 A1* | 7/2020 | Kwak | H01L 27/156 |

FOREIGN PATENT DOCUMENTS

| | | |
|---|---|---|
| KR | 10-2012-0046374 | 5/2012 |
| KR | 101712519 | 3/2017 |

OTHER PUBLICATIONS

Notice of Allowance dated Aug. 26, 2020, issued in U.S. Appl. No. 16/536,627.
Extended European Search Report dated May 3, 2022, issued in European Patent Application No. 19850087.8.
Notice of Allowance dated Jun. 13, 2022, issued to U.S. Appl. No. 17/110,368.
Indian Examination Report dated Nov. 7, 2022, issued to Indian Application No. 202137004990.

* cited by examiner

LIGHT EMITTING DEVICE

CROSS REFERENCE TO RELATED APPLICATIONS

This application is a Continuation of U.S. patent application Ser. No. 17/110,368, filed on Dec. 3, 2020, which is a Continuation of U.S. patent application Ser. No. 16/536,627, filed on Aug. 9, 2019, and claims the benefit of U.S. Provisional Patent Application No. 62/764,961, filed on Aug. 17, 2018, each of which is hereby incorporated by reference for all purposes as if fully set forth herein.

BACKGROUND

Field

Exemplary embodiments of the invention relate generally to a light emitting device, and more specifically, to a light emitting device having a plurality of light emitting layers stacked.

Discussion of the Background

Light emitting diodes as inorganic light sources are being diversely used in various fields, such as display devices, vehicle lamps, and general lighting. Light emitting diodes are rapidly replacing existing light sources due to their longer lifetime, lower power consumption, and faster response speed.

A display device implements various colors by generally utilizing mixed colors of blue, green, and red. Each pixel of a display device includes blue, green, and red sub-pixels, and the color of a particular pixel is determined through the colors of the sub-pixels, and an image is displayed by a combination of pixels.

Light emitting diodes have been mainly used as backlight sources in display devices. However, recently, a micro LED display has been developed as a next generation display, which directly displays images by using the light emitting diodes.

The above information disclosed in this Background section is only for understanding of the background of the inventive concepts, and, therefore, it may contain information that does not constitute prior art.

SUMMARY

Light emitting devices constructed according to exemplary embodiments of the invention have excellent light reproducibility.

Additional features of the inventive concepts will be set forth in the description which follows, and in part will be apparent from the description, or may be learned by practice of the inventive concepts.

A light emitting device according to an exemplary embodiment includes a first light emitting part including a first n-type semiconductor layer, and a first mesa structure including a first active layer, a first p-type semiconductor layer, and a first transparent electrode vertically stacked one over another and exposing a portion of a first surface the first n-type semiconductor layer, a second light emitting part disposed on the exposed portion of the first n-type semiconductor layer and spaced apart from the first mesa structure, and including a second n-type semiconductor layer, a second active layer, a second p-type semiconductor layer, and a second transparent electrode, and a first bonding part bonding and electrically coupling the first n-type semiconductor layer and the second n-type semiconductor layer to each other.

The second light emitting part may include a second mesa structure including the second active layer, the second p-type semiconductor layer, and the second transparent electrode vertically stacked one over another, the second mesa structure may expose a portion of the second n-type semiconductor layer.

The light emitting device may further include a third light emitting part disposed on the exposed portion of the second n-type semiconductor layer, and including a third n-type semiconductor layer, a third active layer, a third p-type semiconductor layer, and a third transparent electrode, and a second bonding part bonding and electrically coupling the second and third light emitting parts to each other between the second n-type semiconductor layer and the third n-type semiconductor layer.

A thickness of the second bonding part may be greater than a thickness of the second active layer.

The first mesa structure, the second mesa structure, and the third light emitting part may have substantially the same size with each other.

The light emitting device may further include a first pad electrically coupled with the first transparent electrode, a second pad electrically coupled with the second transparent electrode, a third pad electrically coupled with the third transparent electrode, and a common pad electrically coupled with the first, second, and third n-type semiconductor layers.

The common pad may be disposed on a second surface of the first n-type semiconductor layer opposing the first surface.

The common pad may be disposed on the exposed portion of the first n-type semiconductor layer.

The common pad may be disposed on the exposed portion of the second n-type semiconductor layer.

The third light emitting part may include a third mesa structure including the third active layer, the third p-type semiconductor layer, and the third transparent electrode, the third mesa structure may expose a portion of the third n-type semiconductor layer, and the common pad may be disposed on the exposed portion of the third n-type semiconductor layer.

The light emitting device may further include a third light emitting part disposed on the exposed portion of the first n-type semiconductor layer and spaced apart from the second light emitting part, the third light emitting part may include a third n-type semiconductor layer, a third active layer, a third p-type semiconductor layer, and a third transparent electrode.

The light emitting device may further include a second bonding part bonding and electrically coupling the first and third light emitting parts to each other between the first n-type semiconductor layer and the third n-type semiconductor layer.

The first bonding part may extend between the first n-type semiconductor layer and the third n-type semiconductor layer, and may bond and electrically couple the first and third light emitting parts to each other.

The first mesa structure, the second light emitting part, and the third light emitting part may have substantially the same size with each other.

The light emitting device may further include a light blocking layer disposed between the second and third light emitting parts on the exposed portion of the first n-type semiconductor layer.

A thickness of the first bonding part may be greater than a thickness of the first active layer.

The second bonding part may be integrated with the first bonding part.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1A:
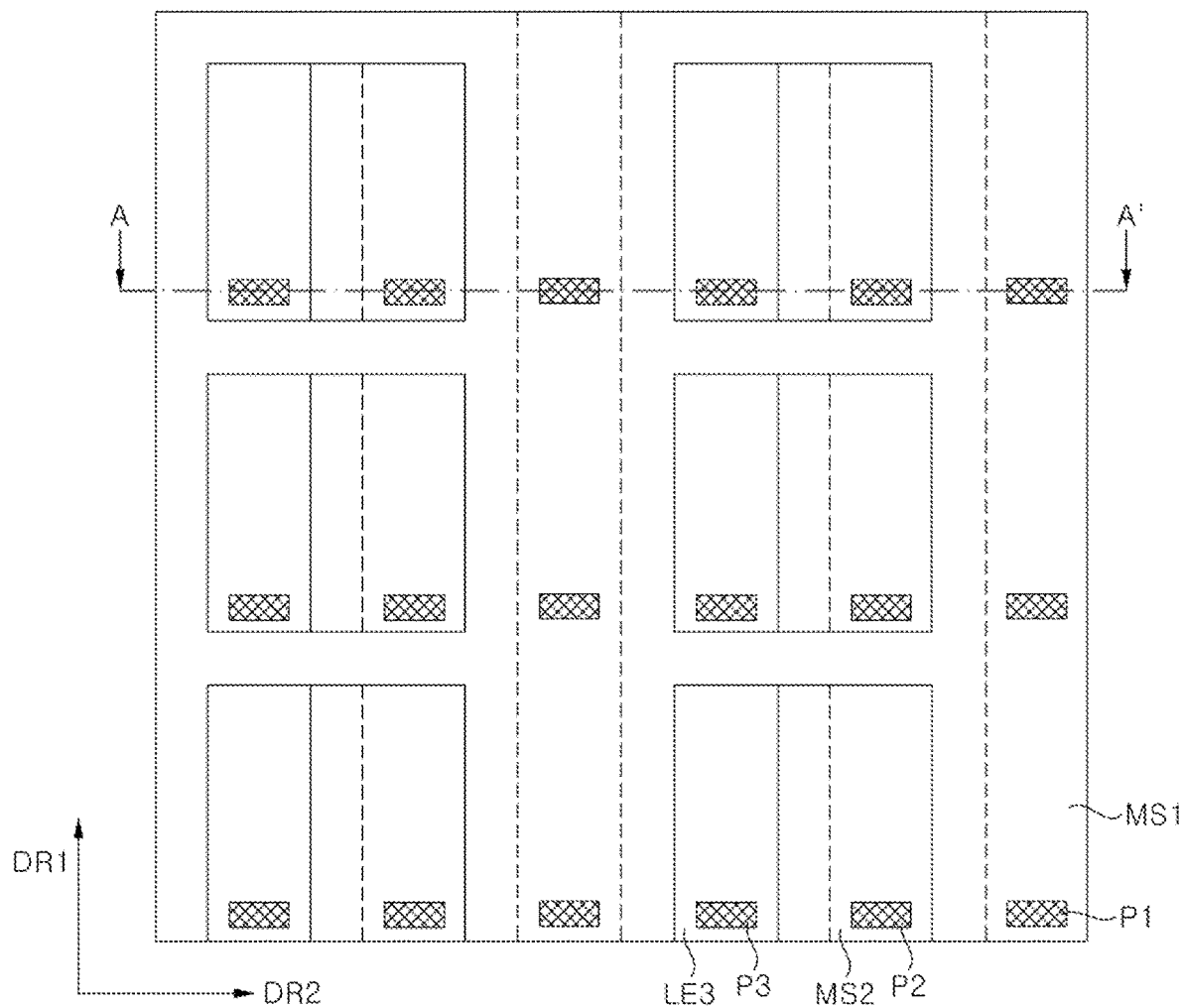
FIG. 1A is a top view of a light emitting device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1B:
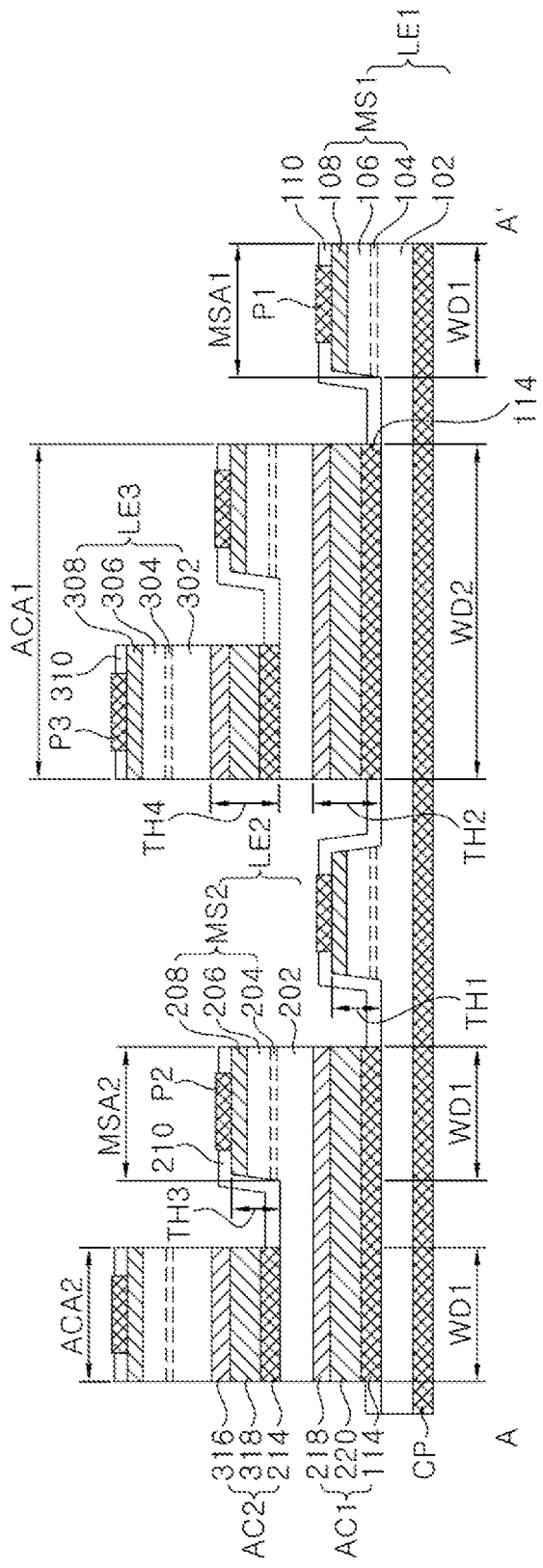
FIG. 1B is a cross-sectional view taken along line A-A' of FIG. 1A.
Figure 1C:
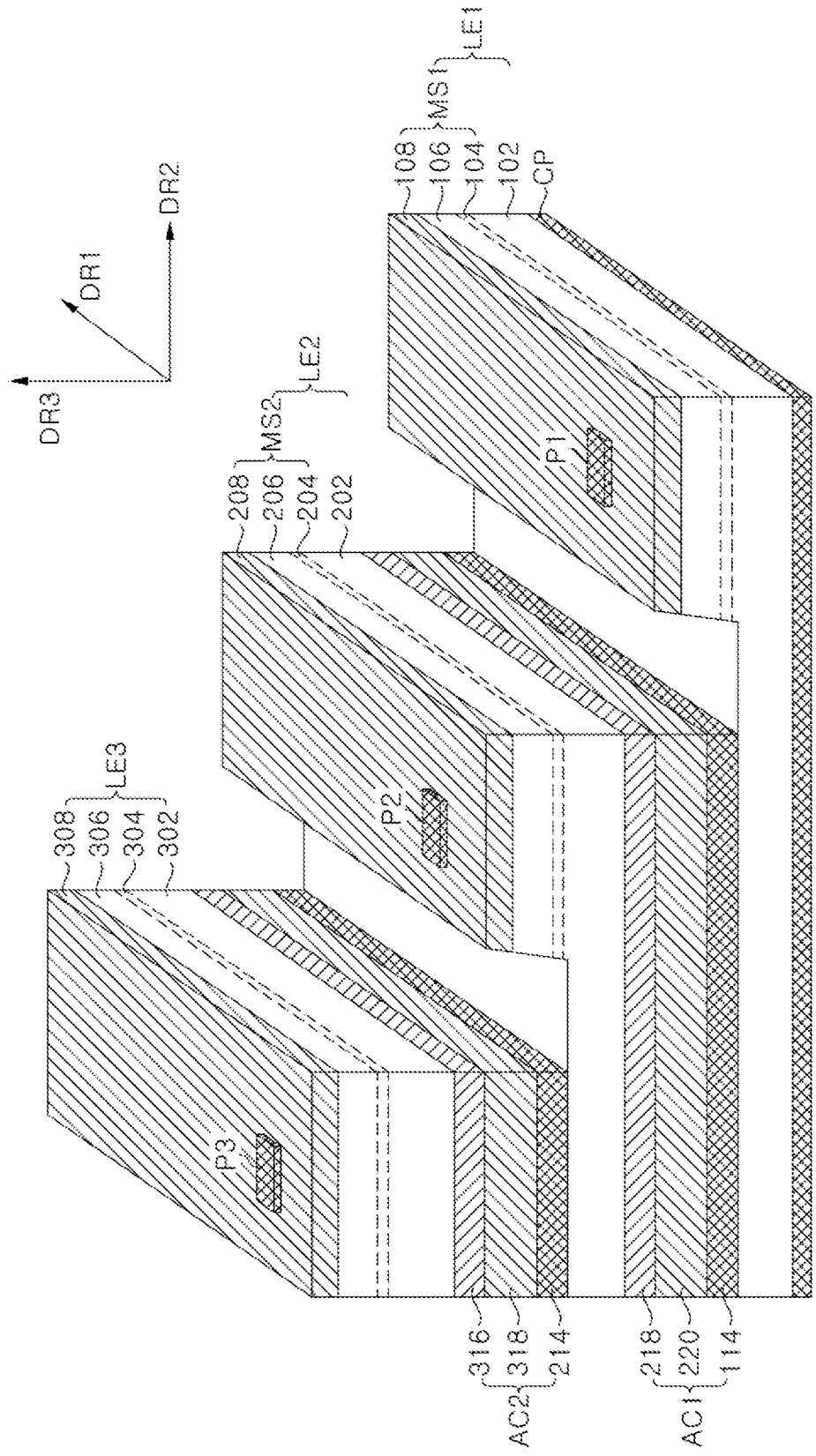
FIG. 1C is a perspective view a portion of the light emitting device of FIG. 1A.
Figure 1D:
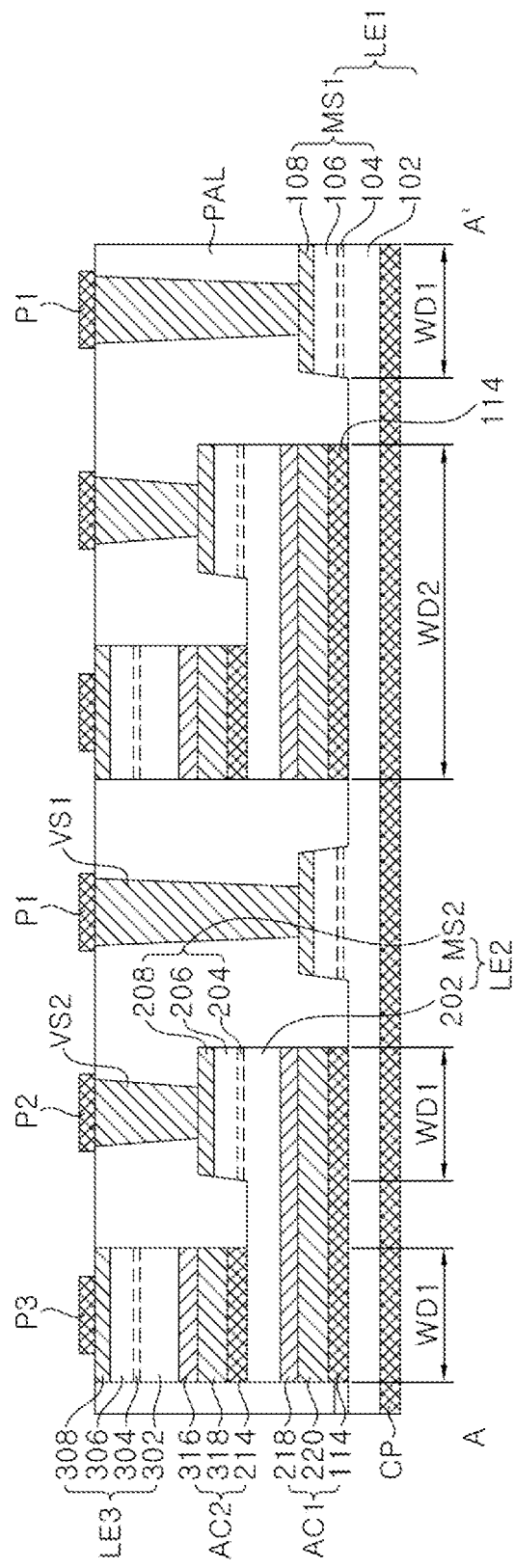
FIG. 1D is a cross-sectional view of a light emitting device of FIG. 1A according to another exemplary embodiment.

FIG. 1A is a top view of a light emitting device according to an exemplary embodiment, FIG. 1B is a cross-sectional view taken along line A-A' of FIG. 1A, and FIG. 1C is a perspective view of a portion of the light emitting device shown in FIG. 1A. FIG. 1D is a cross-sectional view of a light emitting device shown in FIG. 1A according to another exemplary embodiment.

Referring to FIGS. 1A to 1D, a light emitting device may include a first light emitting part LE1, a first bonding part AC1, a second light emitting part LE2, a second bonding part AC2, and a third light emitting part LE3, which are vertically stacked one over another.

The first light emitting part LE1 may include a first n-type semiconductor layer 102, a first active layer 104, a first p-type semiconductor layer 106, and a first transparent electrode 108. The second light emitting part LE2 may include a second n-type semiconductor layer 202, a second active layer 204, a second p-type semiconductor layer 206, and a second transparent electrode 208. The third light emitting part LE3 may include a third n-type semiconductor layer 302, a third active layer 304, a third p-type semiconductor layer 306, and a third transparent electrode 308.

According to an exemplary embodiment, each of the first n-type semiconductor layer 102, the second n-type semiconductor layer 202, and the third n-type semiconductor layer 302 may include a Si-doped gallium nitride-based semiconductor layer, and each of the first p-type semiconductor layer 106, the second p-type semiconductor layer 206, and the third p-type semiconductor layer 306 may include a Mg-doped gallium nitride-based semiconductor layer. Each of the first active layer 104, the second active layer 204, and the third active layer 304 may include a multi-quantum well (MQW), and the composition ratio thereof may be determined to emit light of a desired peak wavelength. Each of the first transparent electrode 108, the second transparent electrode 208, and the third transparent electrode 308 may include a transparent conductive oxide, such as a tin oxide (SnO), an indium oxide (InO2), a zinc oxide (ZnO), an indium tin oxide (ITO), or an indium tin zinc oxide (ITZO).

According to an exemplary embodiment, each of the first light emitting part LE1, the second light emitting part LE2, and the third light emitting part LE3 may emit light having different wavelengths. The stacking sequence of the first light emitting part LE1, the second light emitting part LE2, and the third light emitting part LE3 is not particularly limited, and may be variously modified, which will be described in more detail later.

The first light emitting part LE1 may include a first mesa structure MS1, such that a portion of the first n-type semiconductor layer 102 is exposed in a vertically stacked structure including the first n-type semiconductor layer 102, the first active layer 104, the first p-type semiconductor layer 106, and the first transparent electrode 108.

The first mesa structure MS1 extends in a first direction DR1. Hereafter, a "width" refers to a distance measured in a second direction DR2 perpendicular to the first direction DR1, and a "thickness" refers to a distance measured in a third direction DR3 perpendicular to each of the first direction DR1 and the second direction DR2.

The first light emitting part LE1 may include a first mesa area MSA1 where the first mesa structure MS1 is disposed, and a first bonding area ACA1 separated from the first mesa area MSA1 by a preset distance. The first mesa area MSA1 may have a first width WD1, and the first bonding area ACA1 may have a second width WD2 greater than the first width WD1. The first mesa structure MS1 including the first active layer 104 may have a first thickness TH1.

One sidewall of the first mesa structure MS1 may be substantially coplanar with one sidewall of the first n-type semiconductor layer 102, and may be substantially vertical. The other sidewall of the first mesa structure MS1 which faces away from the one surface may be disposed on the top surface of the middle portion of the first n-type semiconductor layer 102, and may have an inclined structure. In this case, the first active layer 104 may have a width greater than the first p-type semiconductor layer 106, and the first p-type semiconductor layer 106 may have a width greater than the first transparent electrode 108. The first width WD1 of the first mesa structure MS1 may refer to the width of the first active layer 104.

The first bonding part AC1 may be disposed on the first bonding area ACA1. As the first bonding area ACA1 has the second width WD2, the first bonding part AC1 may also have the second width WD2. The first bonding part AC1 may be separated from the first mesa structure MS1 by a preset distance.

The first bonding part AC1 may bond and electrically couple the first light emitting part LE1 and the second light emitting part LE2 to each other. The first bonding part AC1 may include a material, which has an electrical conductivity and a bonding property, such as Al, Au, In, Sn, Ti, Ni, Ag, Cr, W, TiW, Mo, Cu, TiCu, AuSn, and InSn. The first bonding part AC1 may electrically couple the first bonding area ACA1 (e.g., a surface facing the second light emitting part LE2) in the first n-type semiconductor layer 102 of the first light emitting part LE1 to the back surface (e.g., a surface facing the first light emitting part LE1) of the second n-type semiconductor layer 202 of the second light emitting part LE2.

According to an exemplary embodiment, the first bonding part AC1 may have a second thickness TH2, and the second thickness TH2 may be greater than or equal to the first thickness TH1. Since the first thickness TH1 is the thickness of the first mesa structure MS1 including the first active layer 104, and the first bonding part AC1 has a thickness greater than the first mesa structure MS1, the first bonding part AC1 may be thicker than the first active layer 104. In addition, since the first active layer 104 faces one sidewall of the first bonding part AC1 and the first bonding part AC1 includes metal, light generated from the first active layer 104 may be reflected by the first bonding part AC1. In this manner, light generated from the first active layer 104 may be prevented from being incident on the second active layer 204 or the third active layer 304, without an additional color filter or a light blocking layer.

The second light emitting part LE2 may be positioned over the first bonding area ACA1 of the first light emitting part LE1 where the first bonding part AC1 is disposed. Since the first bonding area ACA1 has the second width WD2, the entire width of the second light emitting part LE2 may have the second width WD2.

The second light emitting part LE2 may include a second mesa structure MS2, which exposes a portion of the second n-type semiconductor layer 202 in a vertically stacked structure including the second n-type semiconductor layer 202, the second active layer 204, the second p-type semiconductor layer 206, and the second transparent electrode 208. The second mesa structure MS2 may extend in the first direction DR1, may be separated by a preset distance from the first mesa structure MS1, and may be disposed side by side with the first mesa structure MS1.

In this manner, since the second mesa structure MS2 does not overlap with the first mesa structure MS1 in the third direction DR3, a portion of light emitted in the third direction DR3 among from the first active layer 104 does not exert an influence on the second active layer 204 of the second mesa structure MS2. As such, a color filter or a light blocking layer may be obviated between the first light emitting part LE1 and the second light emitting part LE2 in the third direction DR3. The first active layer 104 is included in the first mesa structure MS1, and is separated by the preset distance from the second mesa structure MS2 in the second direction DR2, and the first light emitting part LE1 and the second light emitting part LE2 may be separated by the first bonding part AC1 in the third direction DR3. As such, since the second active layer 204 is sufficiently separated vertically and horizontally from the first active layer 104, light emitted from the second active layer 204 may not exert an influence on the first active layer 104.

A light emitting device may generally have a structure, in which a second light emitting part is vertically stacked on a first light emitting part, such that a first active layer and a second active layer overlap with each other. In this case, when the direction of the second light emitting part LE2 is a light extraction direction, the wavelength of light generated from the second light emitting part should be longer than the wavelength of light generated from the first light emitting part LE1. According to the illustrated exemplary embodiment, since the first active layer 104 and the second active layer 204 do not to overlap with each other, the first light emitting part LE1 and the second light emitting part LE2 may be stacked one over another regardless of a wavelength of light emitted therefrom. More particularly, the first light emitting part LE1 emitting a longer wavelength of light may be disposed on the second light emitting part LE2 emitting a shorter wavelength of light, or vice versa.

The second light emitting part LE2 may include a second mesa area MSA2 where the second mesa structure MS2 is positioned, and a second bonding area ACA2 separated from the second mesa area MSA2 by a preset distance. The second mesa structure MS2 including the second active layer 204 may have a third thickness TH3. The second mesa area MSA2 may have substantially the same first width WD1 as the first mesa area MSA1, and the second bonding area ACA2 may also have the first width WD1.

One sidewall of the second mesa structure MS2 may be substantially coplanar with one sidewall of the second n-type semiconductor layer 202, and may be substantially vertical. The other sidewall of the second mesa structure MS2 which faces away from the one surface may be disposed on the top surface of the middle portion of the second n-type semiconductor layer 202, and may have an inclined structure. In this case, the second active layer 204 may have a width greater than the second p-type semiconductor layer 206, and the second p-type semiconductor layer 206 may have a width greater than the second transparent electrode 208. The first width WD1 of the second mesa structure MS2 may refer to the width of the second active layer 204.

The second bonding part AC2 may be disposed on the second bonding area ACA2. Since the second bonding area ACA2 has the first width WD1, the second bonding part AC2 may also have the first width WD1. The second bonding part AC2 may be separated from the second mesa structure MS2 by a preset distance.

The second bonding part AC2 may bond and electrically couple the second light emitting part LE2 and the third light emitting part LE3 to each other. The second bonding part AC2 may include a material, which has an electrical conductivity and a bonding property, such as Al, Au, In, Sn, Ti, Ni, Ag, Cr, W, TiW, Mo, Cu, TiCu, AuSn, and InSn. The second bonding part AC2 may electrically couple the second bonding area ACA2 (e.g., a surface facing the third light emitting part LE3) in the second n-type semiconductor layer 202 of the second light emitting part LE2 to the back surface (e.g., a surface facing the second light emitting part LE2) of the third n-type semiconductor layer 302 of the third light emitting part LE3 with each other. The first bonding part AC1 may electrically couple the first n-type semiconductor layer 102 of the first light emitting part LE1 and the second n-type semiconductor layer 202 of the second light emitting part LE2 with each other, and the second bonding part AC2 may electrically couple the second n-type semiconductor layer 202 of the second light emitting part LE2 and the third n-type semiconductor layer 302 of the third light emitting part LE3 with each other. As such, the first n-type semiconductor layer 102, the second n-type semiconductor layer 202, and the third n-type semiconductor layer 302 may be electrically coupled with one another by the first bonding part AC1 and the second bonding part AC2.

According to an exemplary embodiment, the second bonding part AC2 may have a fourth thickness TH4, and the fourth thickness TH4 may be greater than or equal to the third thickness TH3. Since the second active layer 204 faces one sidewall of the second bonding part AC2 and the second bonding part AC2 includes metal, light generated from the second active layer 204 may be reflected by the second bonding part AC2. In this manner, light generated from the second active layer 204 may be prevented from being incident on the third active layer 304, without an addition color filter or a light blocking layer.

The third light emitting part LE3 may have a structure, in which the third n-type semiconductor layer 302, the third active layer 304, the third p-type semiconductor layer 306, and the third transparent electrode 308 are stacked one over another with substantially the same width. In particular, the third light emitting part LE3 may not have a mesa structure. The light emitting area of the third light emitting part LE3 may be substantially the same as the entire area of the third light emitting part LE3.

The third light emitting part LE3 may extend in the first direction DR1, may be separated from the first mesa structure MS1 and the second mesa structure MS2 by preset distances, and may be disposed side by side with the first mesa structure MS1 and the second mesa structure MS2. Since the third light emitting part LE3 does not overlap with the second mesa structure MS2 including the second active layer 204 and the first mesa structure MS1 including the first active layer 104, light generated from the first active layer 104 and the second active layer 204 may not exert an influence on the third active layer 304 of the third light emitting part LE3. As such, a color filter or a light blocking layer may be obviated between the first light emitting part LE1, the second light emitting part LE2, and the third light emitting part LE3. The third active layer 304 disposed over the second bonding area ACA2 and the second active layer 204 disposed in the second mesa area MSA2 may be separated in the second direction DR2 by a distance substantially the same as a distance between the second bonding area ACA2 and the second mesa area MSA2. The third active layer 304 may be separated from the second active layer 204 in the third direction DR3 by the fourth thickness TH4 of the second bonding part AC2 and the thickness of the third n-type semiconductor layer 302. In this manner, as the third active layer 304 is sufficiently separated in the vertical and horizontal directions from the second active layer 204, light generated from the third active layer 304 may not exert an influence on the second active layer 204.

A light emitting device may generally have a structure, in which a second light emitting part and a third light emitting part are vertically stacked on a first light emitting part LE1, such that a first active layer, a second active layer, and a third active layer 304 overlap with one another. In this case, when the direction of the third light emitting part LE3 is a light extraction direction, the wavelength of light generated from the first light emitting part LE1 should be longer than the wavelength of light generated from the second light emitting part LE2, and the wavelength of light generated from the second light emitting part LE2 should be longer than the wavelength of light generated from the third light emitting part LE3. According to the illustrated exemplary embodiment, since the first active layer 104, the second active layer 204, and the third active layer 304 do not to overlap with one another, the first light emitting part LE1, the second light emitting part LE2, and the third light emitting part LE3 may be stacked one over another regardless of a wavelength of light emitted therefrom.

The third light emitting part LE3 may be positioned over the second bonding area ACA2 of the second light emitting part LE2, in which the second bonding part AC2 is disposed. As the second bonding area ACA2 has the first width WD1, the entire width of the third light emitting part LE3 may be the first width WD1. As described above, the light emitting area of the first light emitting part LE1 may have the first width WD1, the light emitting area of the second light emitting part LE2 may have the first width WD1, and the light emitting area of the third light emitting part LE3 may have the first width WD1. In this manner, as the light emitting areas of the respective first light emitting part LE1, second light emitting part LE2, and third light emitting part LE3 have substantially the same size, the amount of light generated from the respective first light emitting part LE1, second light emitting part LE2, and third light emitting part LE3 may be substantially the same, and thus, reliability in generating a color may be improved.

The light emitting device may further include a first pad P1 electrically coupled with the first transparent electrode 108 of the first light emitting part LE1, a second pad P2 electrically coupled with the second transparent electrode 208 of the second light emitting part LE2, a third pad P3 electrically coupled with the third transparent electrode 308 of the third light emitting part LE3, and a common pad CP electrically coupled with the first n-type semiconductor layer 102, the second n-type semiconductor layer 202, and the third n-type semiconductor layer 302.

In the light emitting device according to the illustrated exemplary embodiment, the direction of the third light emitting part LE3 may be a light extraction direction. In order for light to be maximally emitted from the light extraction surface, each of the first pad P1, the second pad P2 and the third pad P3 may have a minimal area. The common pad CP may be disposed on the other surface of the first n-type semiconductor layer 102. For example, the common pad CP may entirely cover the first n-type semiconductor layer 102, without being limited thereto. As another example, the common pad CP may partially covers the first n-type semiconductor layer 102.

Referring to FIG. 1D, according to another exemplary embodiment, the third light emitting part LE3 is stacked over the second light emitting part LE2, and the second light emitting part LE2 is stacked over the first light emitting part LE1. As such, the surface levels of the first light emitting part LE1, the second light emitting part LE2, and the third light emitting part LE3 may be different from one another. In order to dispose the first pad P1, the second pad P2, and the third pad P3 at substantially the same level, the light emitting device may further include a passivation layer PAL, which covers the first light emitting part LE1, the second light emitting part LE2, and the third light emitting part LE3 and has a top surface substantially the same as the top surface of the third transparent electrode 308. The passivation layer PAL may include, for example, SOG (silicon on glass), epoxy, polyimide, SUB, BCB (benzo cyclo butene), or others, which has a high light transmittance and a flowable characteristic. The respective first pad P1, second pad P2, and third pad P3 may be disposed on the passivation layer PAL. The first pad P1 may be electrically coupled with the first transparent electrode 108 through a first via structure VS1, the second pad P2 may be electrically coupled with the second transparent electrode 208 through a second via structure VS2, and the third pad P3 may be directly contacting the third transparent electrode 308. Each of the first via structure VS1 and the second via structure VS2 may have a width that gradually decreases in a downward direction and an inclined sidewall. Each of the first pad P1, the second pad P2, and the third pad P3 may include Au, for example. Each of the first via structure VS1 and the second via structure VS2 may include at least one of Au, Al, Ni, Ti, Cr, Cu, W, TiW, Mo, Cu, TiCu, AuSn, and InSn.

Figure 2A:
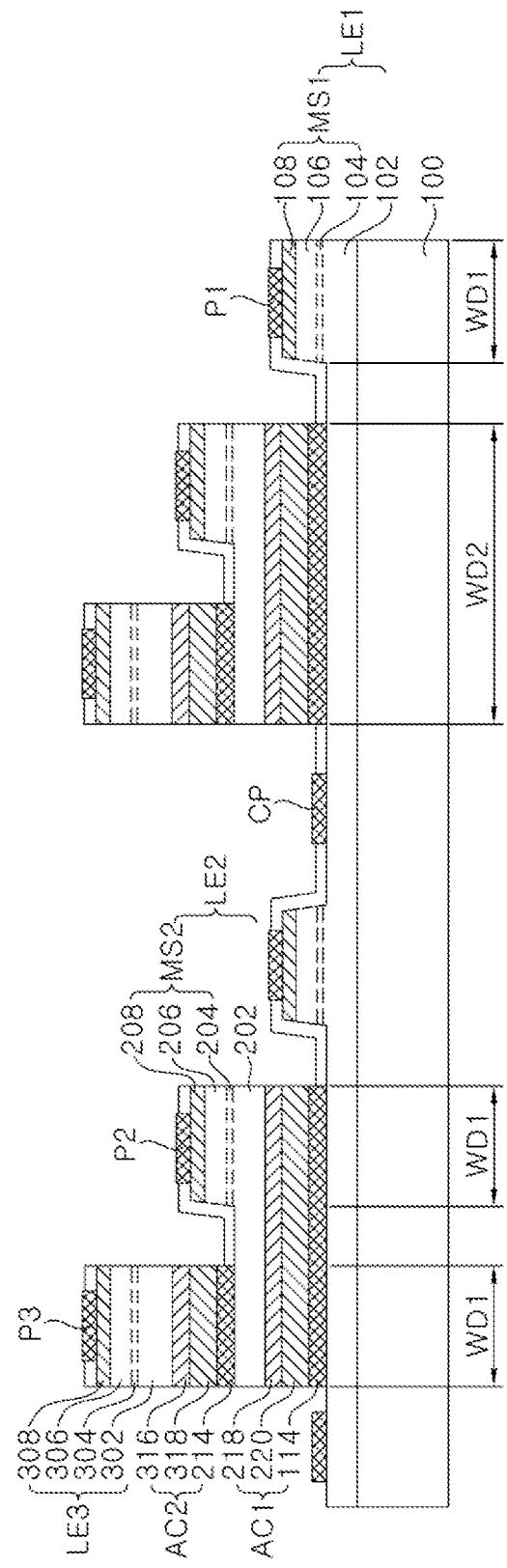
FIGS. 2A, 2B, and 2C are cross-sectional views of a light emitting device according to an exemplary embodiment.
Figure 2B:
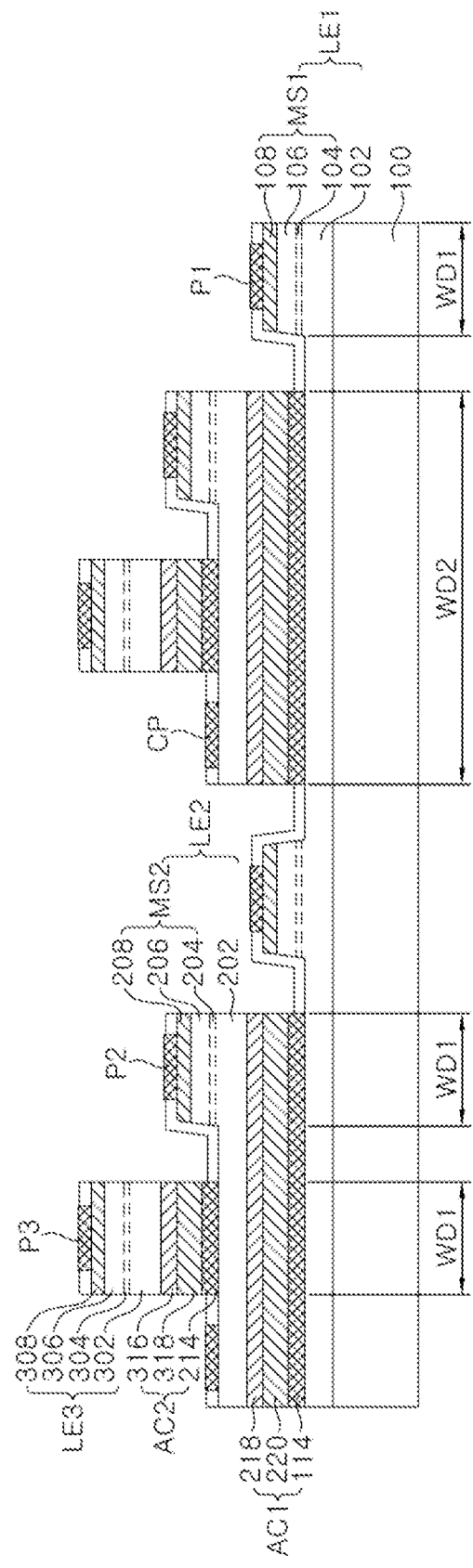
Figure 2C:
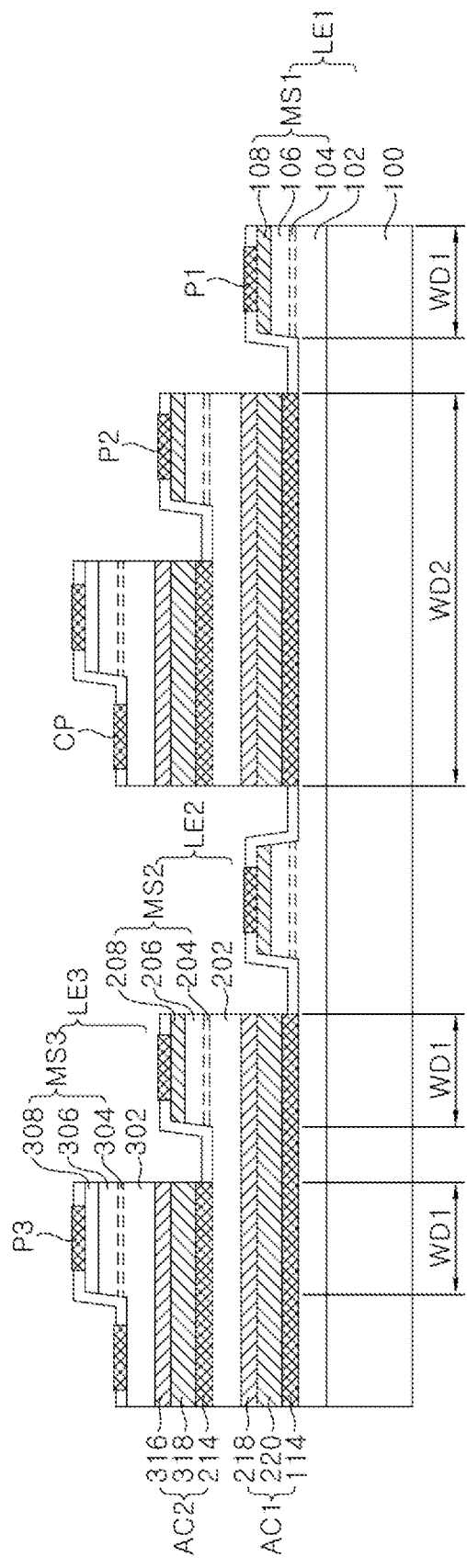

FIGS. 2A to 2C are cross-sectional views of a light emitting device according to an exemplary embodiment.

Referring to FIGS. 2A to 2C, a light emitting device may include a first light emitting part LE1, a first bonding part AC1, a second light emitting part LE2, a second bonding part AC2, and a third light emitting part LE3, which are sequentially disposed on a substrate 100.

The substrate 100 may be a substrate capable of growing a gallium nitride-based semiconductor layer thereon, which may include a sapphire ($Al_2O_3$), a silicon carbide (SiC), a gallium nitride (GaN), an indium gallium nitride (InGaN), an aluminum gallium nitride (AlGaN), an aluminum nitride (AlN), a gallium oxide ($Ga_2O_3$), or silicon. Also, the substrate 100 may be a patterned sapphire substrate.

The first light emitting part LE1 is disposed on one surface of the substrate 100. The first light emitting part LE1 may include a first n-type semiconductor layer 102 and a first mesa structure MS1, which exposes a portion of the first n-type semiconductor layer 102 on a vertically stacked structure including the first n-type semiconductor layer 102, a first active layer 104, a first p-type semiconductor layer 106, and a first transparent electrode 108.

The second light emitting part LE2 may include a second n-type semiconductor layer 202 and a second mesa structure MS2, which exposes a portion of the second n-type semiconductor layer 202 on a vertically stacked structure including the second n-type semiconductor layer 202, a second active layer 204, a second p-type semiconductor layer 206, and a second transparent electrode 208.

The third light emitting part LE3 may include a third n-type semiconductor layer 302, a third active layer 304, a third n-type semiconductor layer 302, and a third transparent electrode 308. According to the illustrated exemplary embodiment, the third light emitting part LE3 shown in FIGS. 2A and 2B does not have a mesa structure, and the third n-type semiconductor layer 302, the third active layer 304, the third p-type semiconductor layer 306, and the third transparent electrode 308 may have substantially the same width. According to another exemplary embodiment, the third light emitting part LE3 may include a third mesa structure MS3, as shown in FIG. 2C, which exposes a portion of the third n-type semiconductor layer 302 on a vertically stacked structure including the third n-type semiconductor layer 302, the third active layer 304, the third p-type semiconductor layer 306, and the third transparent electrode 308.

Referring to FIGS. 2A to 2C, the light emitting device may further include a first pad P1 which is electrically coupled with the first transparent electrode 108, a second pad P2 which is electrically coupled with the second transparent electrode 208, and a third pad P3 which is electrically coupled with the third transparent electrode 308.

The first n-type semiconductor layer 102 of the first light emitting part LE1 and the second n-type semiconductor layer 202 of the second light emitting part LE2 may be electrically coupled with each other by the first bonding part AC1, and the second n-type semiconductor layer 202 of the second light emitting part LE2 and the third n-type semiconductor layer 302 of the third light emitting part LE3 may be electrically coupled with each other by the second bonding part AC2. The light emitting device may further include a common pad CP, which electrically couples the first n-type semiconductor layer 102, the second n-type semiconductor layer 202, and the third n-type semiconductor layer 302.

According to an exemplary embodiment shown in FIG. 2A, the common pad CP may be brought into electrical contact with the first n-type semiconductor layer 102 on the first light emitting part LE1. As such, the common pad CP may be electrically coupled with the second n-type semiconductor layer 202 and the third n-type semiconductor layer 302 through the first n-type semiconductor layer 102. In this case, since the features of the light emitting device are substantially the same as the features described of the light emitting device described above with reference to FIG. 1A, except that the first n-type semiconductor layer 102 of the first light emitting part LE1 has a width greater than the width of the first n-type semiconductor layer 102 of the first light emitting part LE1 shown in FIG. 1A to dispose the common pad CP thereon, repeated descriptions thereof will be omitted to avoid redundancy.

According to another exemplary embodiment shown in FIG. 2B, the common pad CP may be brought into electrical contact with the second n-type semiconductor layer 202 on the second light emitting part LE2. As such, the common pad CP may be electrically coupled with the first n-type semiconductor layer 102 and the third n-type semiconductor layer 302 through the second n-type semiconductor layer 202. In this case, since the features of the light emitting device are substantially the same as the features of the light emitting device described above with reference to FIG. 1A, except that the second n-type semiconductor layer 202 of the second light emitting part LE2 has a width greater than the width of the second n-type semiconductor layer 202 of the second light emitting part LE2 shown in FIG. 1A to dispose the common pad CP thereon, repeated descriptions thereof will be omitted.

According to still another exemplary embodiment shown in FIG. 2C, the common pad CP may be brought into electrical contact with the third n-type semiconductor layer 302 on the third light emitting part LE3. As such, the common pad CP may be electrically coupled with the first n-type semiconductor layer 102 and the second n-type semiconductor layer 202 through the third n-type semiconductor layer 302. Since the features of the light emitting device are substantially the same as the features of the light emitting device described above with reference to FIG. 1A, except that the third light emitting part LE3 includes the third mesa structure MS3 exposing the third n-type semiconductor layer 302, such that the common pad CP is disposed on the third n-type semiconductor layer 302 of the third light emitting part LE3 as shown in FIG. 2C, repeated descriptions thereof will be omitted.

In the illustrated exemplary embodiments, since the features of the first light emitting part LE1, the first bonding part AC1, the second light emitting part LE2, the second bonding part AC2, the third light emitting part LE3, the first pad P1, the second pad P2, the third pad P3 and the common pad CP are substantially the same as those made above with reference to FIGS. 1A to 1D, repeated descriptions thereof will be omitted to avoid redundancy.

Figure 3A:
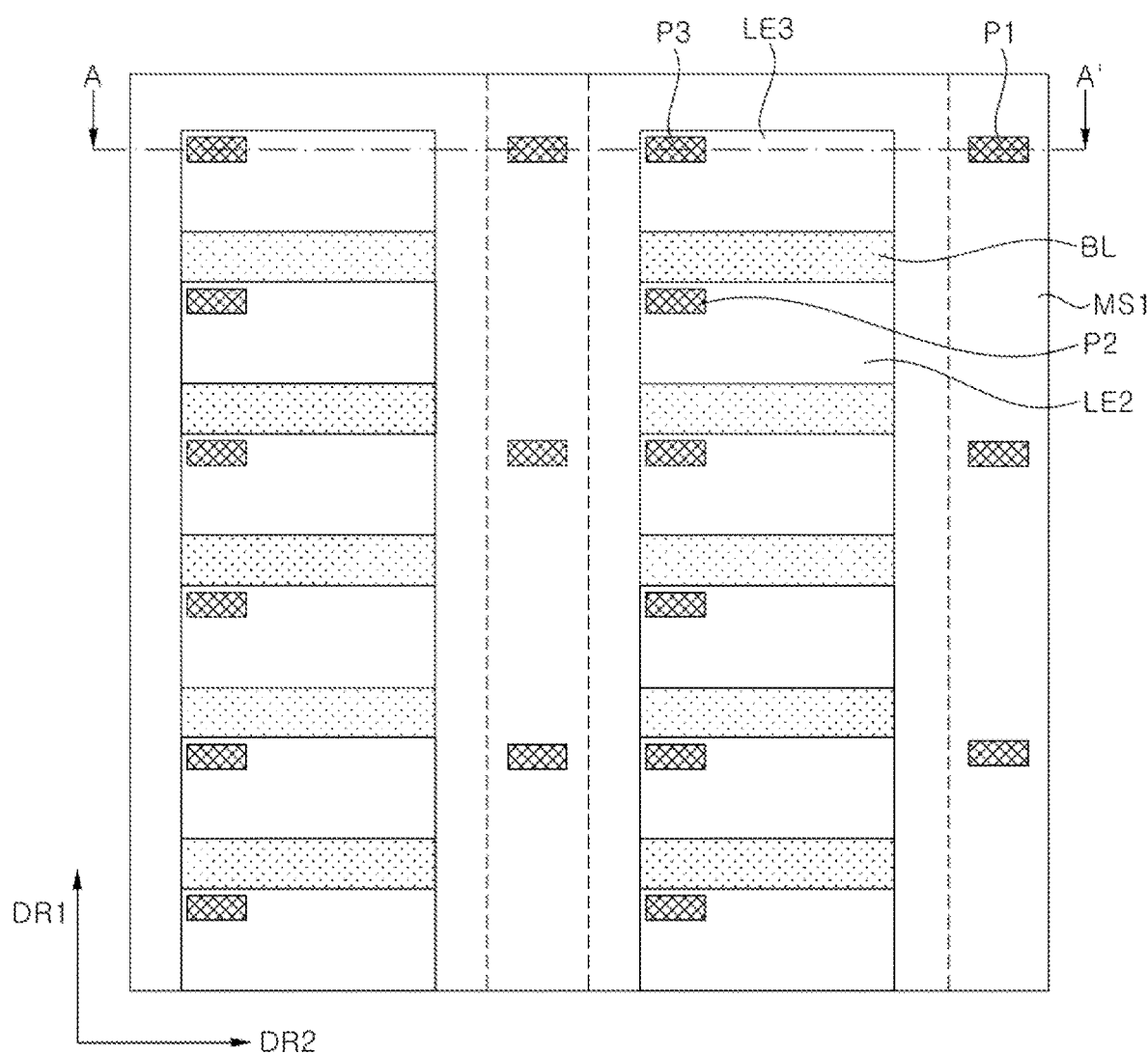
FIG. 3A is a plan view of a light emitting device according to an exemplary embodiment.
Figure 3B:
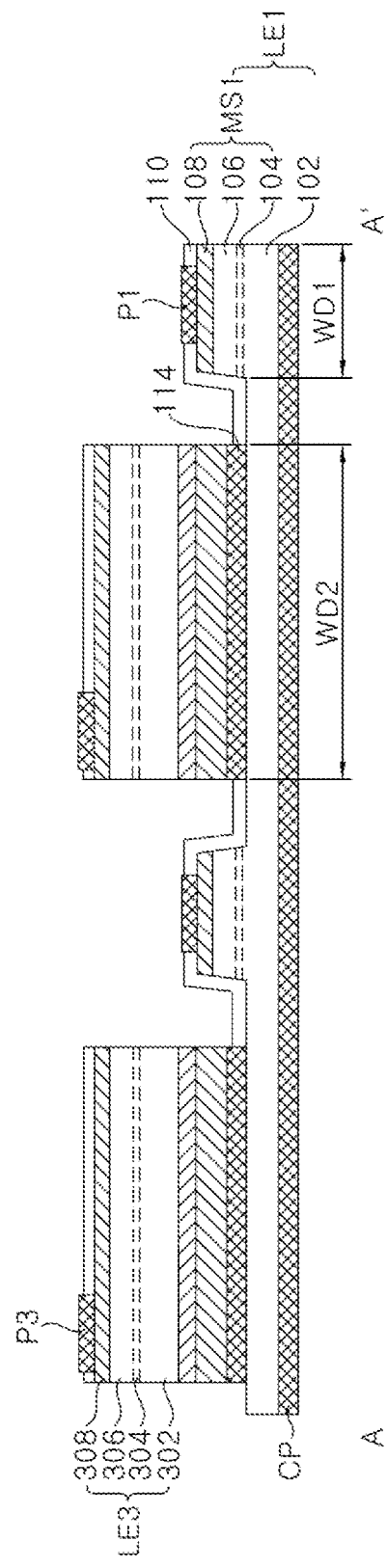
FIG. 3B is a cross-sectional view taken along line A-A' of FIG. 3A.

FIG. 3A is a plan view of a light emitting device according to an exemplary embodiment, and FIG. 3B is a cross-sectional view taken along line A-A' of FIG. 3A.

Referring to FIGS. 3A and 3B, a light emitting device may include a first light emitting part LE1, a second light emitting part LE2, a third light emitting part LE3, a bonding part, a first pad P1, a second pad P2, and a third pad P3.

The first light emitting part LE1 may include a first n-type semiconductor layer 102 and a first mesa structure MS1, which exposes a portion of the first n-type semiconductor layer 102 on a vertically stacked structure including the first n-type semiconductor layer 102, a first active layer 104, a first p-type semiconductor layer 106, and a first transparent electrode 108. The first mesa structure MS1 may extend in a first direction DR1, and may have a first width WD1 in a second direction DR2.

The second light emitting part LE2 may include a second n-type semiconductor layer 202, a second active layer 204, a second p-type semiconductor layer 206, and a second transparent electrode 208 which are vertically stacked. The second light emitting part LE2 does not have a mesa structure. The second light emitting part LE2 may extend in the second direction DR2, and may have the first width WD1 in the first direction DR1.

The third light emitting part LE3 may include a third n-type semiconductor layer 302, a third active layer 304, a third p-type semiconductor layer 306, and a third transparent electrode 308, which are vertically stacked. The third light emitting part LE3 does not have a mesa structure. The third light emitting part LE3 may extend in the second direction DR2, and may have the first width WD1 in the first direction DR1.

The light emitting device may have a structure, in which the second light emitting part LE2 and the third light emitting part LE3 are separated from each other on the first light emitting part LE1. In particular, the second light emitting part LE2 and the third light emitting part LE3 may be separated from each other on the first n-type semiconductor layer 102, and may also be separated from the first mesa structure MS1.

For example, the second light emitting part LE2 and the third light emitting part LE3 may be bonded and electrically coupled with each other by the bonding part on the first n-type semiconductor layer 102 of the first light emitting part LE1. As such, the first n-type semiconductor layer 102 may be brought into contact with and electrically coupled with the second n-type semiconductor layer 202 of the second light emitting part LE2, and may be brought into contact with and electrically coupled with the third n-type semiconductor layer 302 of the third light emitting part LE3 by the bonding part.

As another example, the bonding part may include a first pattern, which bonds and electrically couples the second light emitting part LE2 and the first n-type semiconductor layer 102 of the first light emitting part LE1, and a second pattern, which is separated from the first pattern, bonds and electrically couples the third light emitting part LE3 and the first n-type semiconductor layer 102 of the first light emitting part LE1.

A light blocking layer BL may be additionally provided between the second light emitting part LE2 and the third light emitting part LE3, such that light generated from the second active layer 204 may not be incident on the third light emitting part LE3 or light generated from the third active layer 304 may not be incident on the second light emitting part LE2. As the light blocking layer BL, for example, a black matrix may be used.

The first pad P1 may be brought into electrical contact with the first transparent electrode 108 of the first light emitting part LE1, the second pad P2 may be brought into electrical contact with the second transparent electrode 208 of the second light emitting part LE2, and the third pad P3 may be brought into electrical contact with the third transparent electrode 308 of the third light emitting part LE3. A common pad CP may be disposed on the bottom surface of the first n-type semiconductor layer 102 of the first light emitting part LE1. For example, the common pad CP may be disposed to completely cover the bottom surface of the first n-type semiconductor layer 102 of the first light emitting part LE1. As another example, the common pad CP may be brought into partial contact with the first n-type semiconductor layer 102 of the first light emitting part LE1. Further, as shown in FIGS. 2A to 2C, the common pad CP may be brought into electrical contact with the first n-type semiconductor layer 102, may be brought into electrical contact with the second n-type semiconductor layer 202, or may be brought into electrical contact with the third n-type semiconductor layer 302. In each of these cases, the structures of the first light emitting part LE1, the second light emitting part LE2, and the third light emitting part LE3 may be anyone of those described above with reference to FIGS. 2A to 2C.

Hereinafter, a method for manufacturing the light emitting device described above with reference to FIGS. 1A to 1C will be exemplarily described.

FIGS. 4A to 16A are top views illustrating a method for manufacturing a light emitting device according to an exemplary embodiment, and FIGS. 4A to 16B are cross-sectional views taken along lines A-A' of corresponding top views shown in FIGS. 4A to 16A, respectively.

Figure 4A:
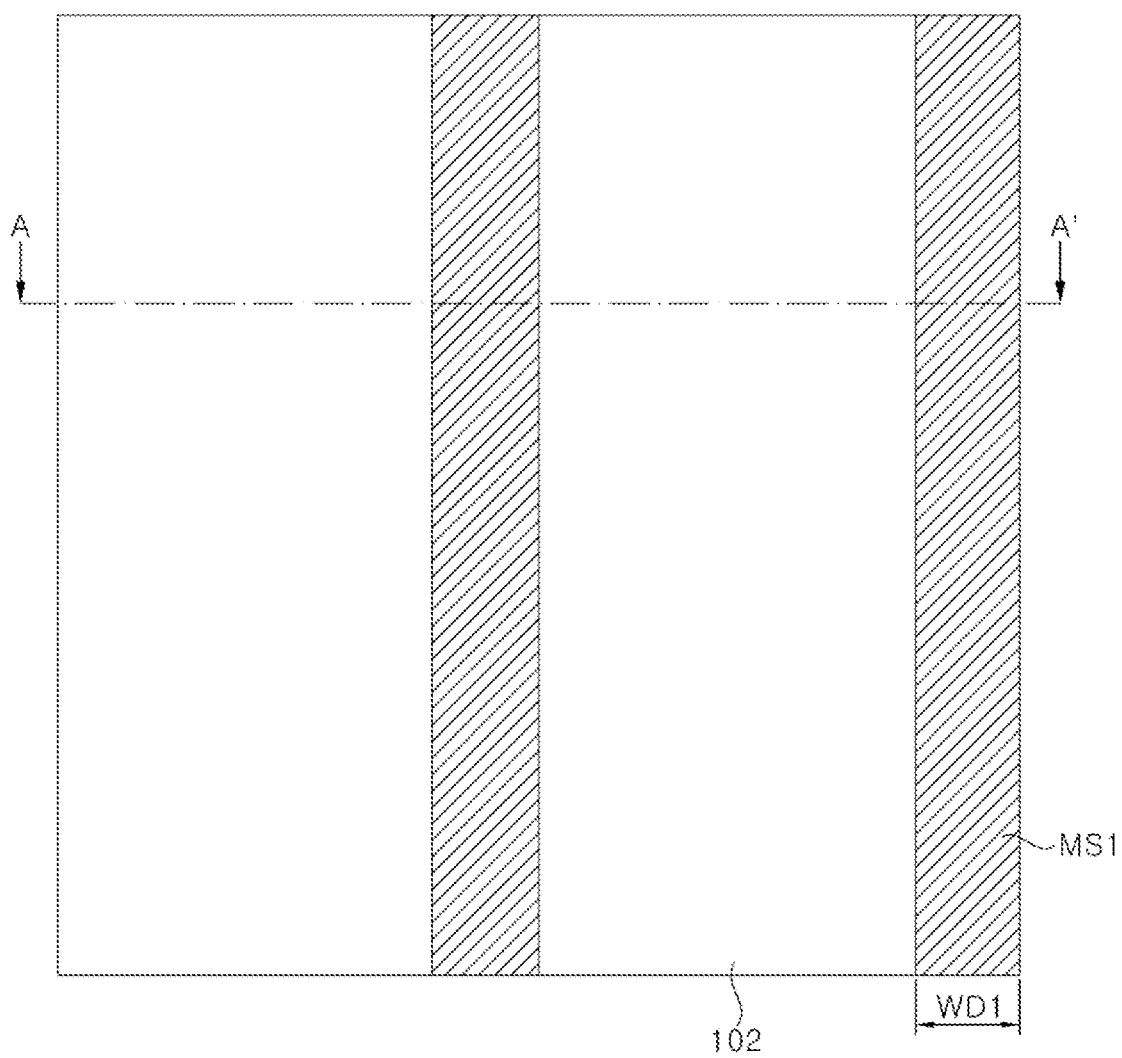
FIGS. 4A, 5A, 6A, 7A, 8A, 9A, 10A, 11A, 12A, 13A, 14A, 15A, and 16A are top views for illustrating a method of manufacturing a light emitting device according to an exemplary embodiment.
Figure 4B:
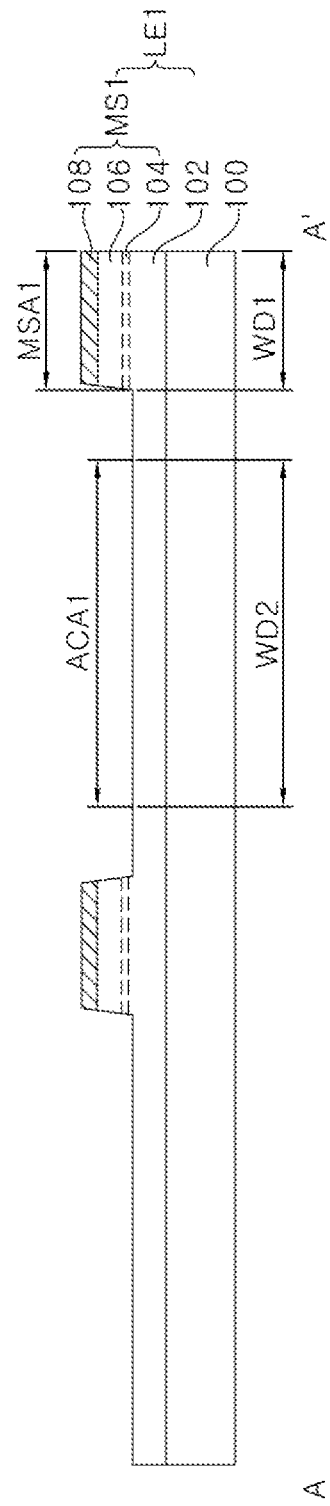
FIGS. 4B, 5B, 6B, 7B, 8B, 9B, 10B, 11B, 12B, 13B, 14B, 15B, and 16B are cross-sectional views taken along lines A-A' of corresponding tops view of FIGS. 4A to 16A, respectively.

Referring to FIGS. 4A and 4B, a plurality of first light emitting parts LE1 may be formed on a first substrate 100.

In more detail, a first n-type semiconductor layer 102, a first active layer 104, a first p-type semiconductor layer 106, and a first transparent electrode 108 may be sequentially formed on the first substrate 100. By etching the first transparent electrode 108, the first p-type semiconductor layer 106, and the first active layer 104, the first light emitting parts LE1 each including a first mesa structure MS1, in which the first active layer 104, the first p-type semiconductor layer 106, and the first transparent electrode 108 are vertically stacked, may be formed.

The first light emitting part LE1 may include a first mesa area MSA1 where the first mesa structure MS1 is disposed, and a first bonding area ACA1 which is separated from the first mesa area MSA1 by a preset distance. The first mesa area MSA1 may have a first width WD1, and the first bonding area ACA1 may have a second width WD2 greater than the first width WD1.

Figure 5A:
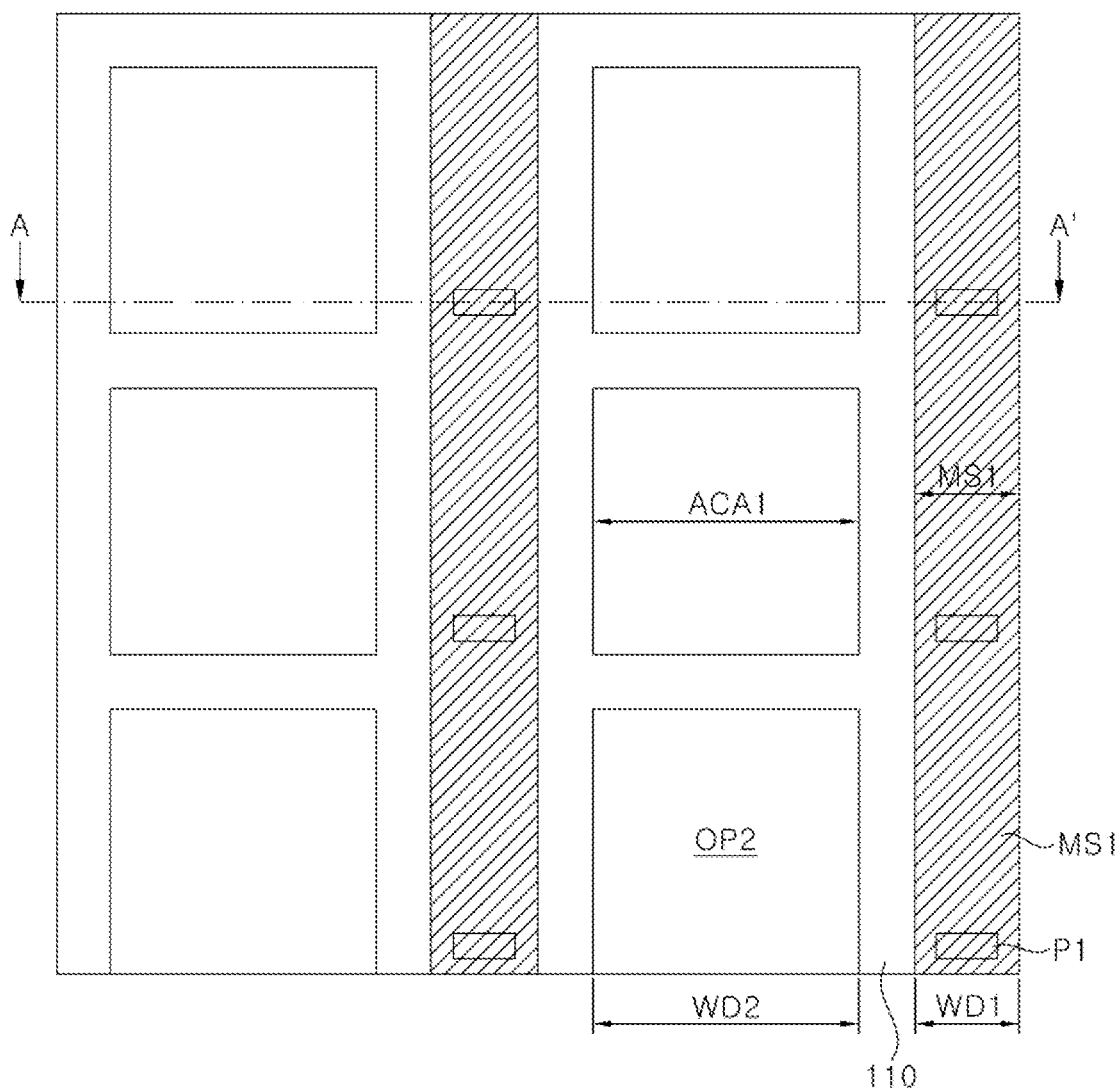
Figure 5B:
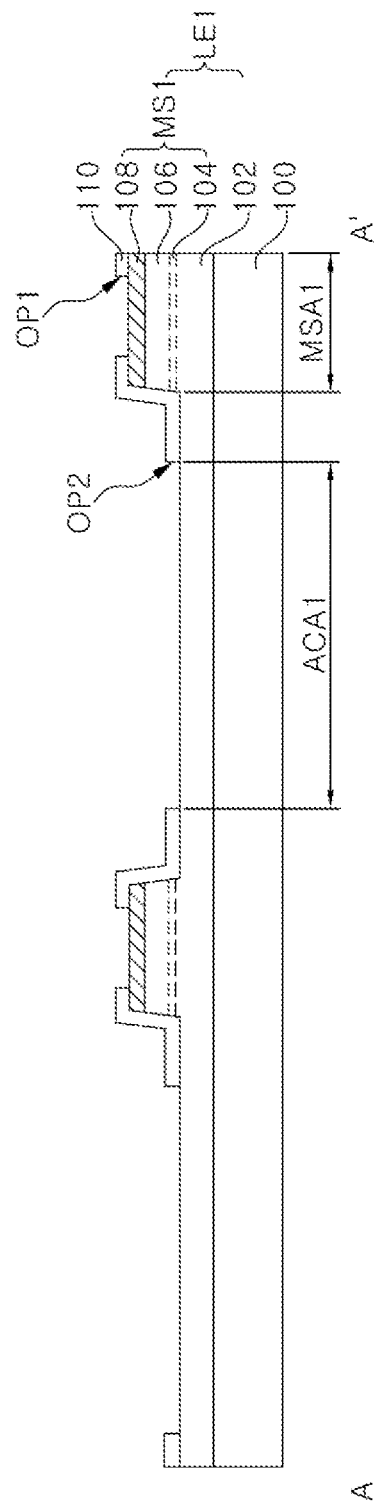

Referring to FIGS. 5A and 5B, a first insulation layer 110 may be formed on the first substrate 100, on which the first light emitting parts LE1 are formed. The first insulation layer 110 may include $SiO_2$, $SiN_x$, $Al_2O_3$, or others. By etching the first insulation layer 110, first openings OP1 exposing the first transparent electrodes 108 and second openings OP2 exposing the first bonding areas ACA1 may be formed.

Alternatively, in some exemplary embodiments, rather than forming the first openings OP1 on the first insulation layer 110, which is disposed on the first transparent electrodes 108, a plurality of through holes may be formed. The plurality of through holes may be uniformly arranged.

Figure 6A:
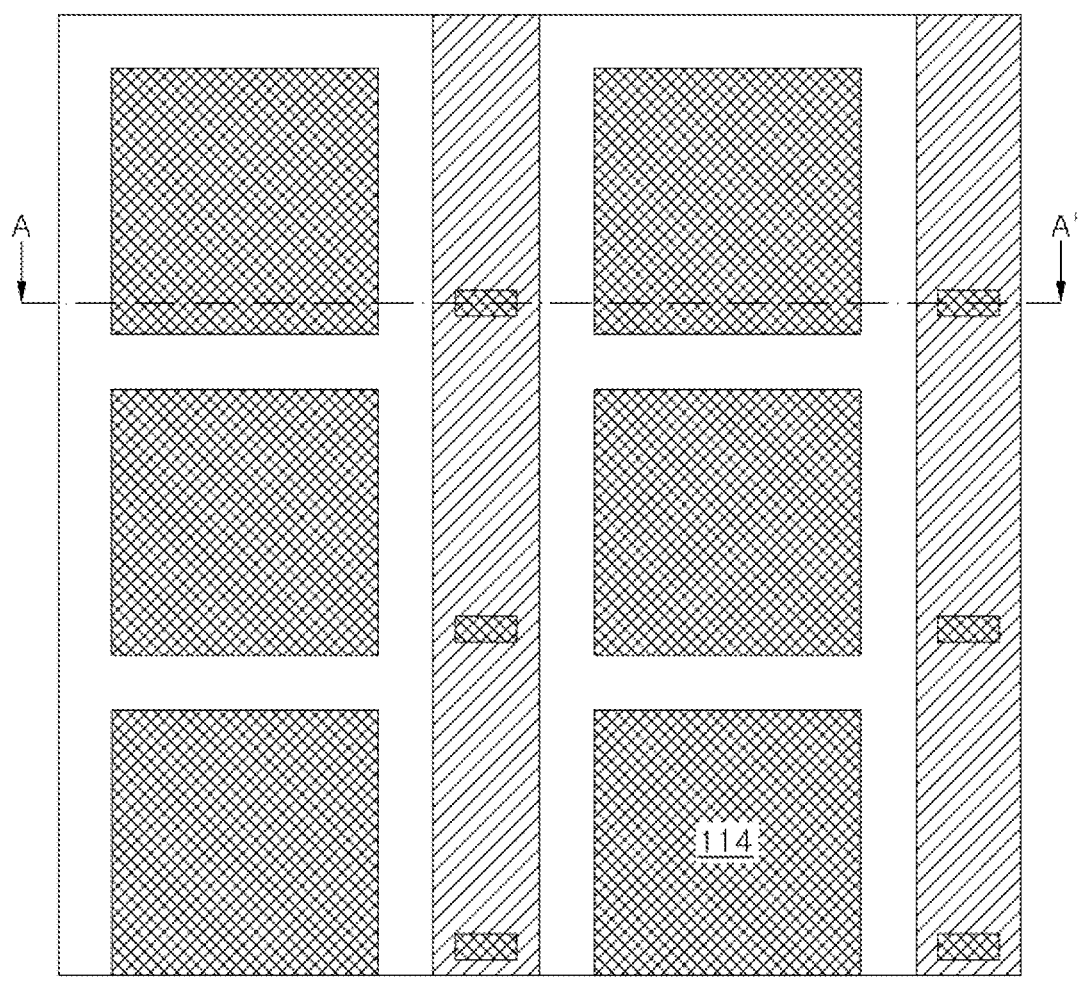
Figure 6B:
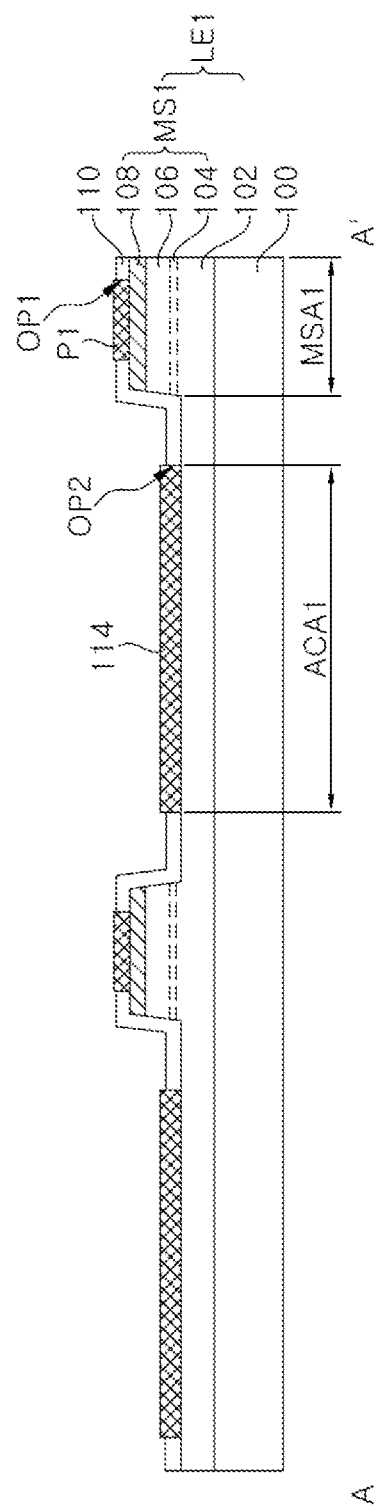

Referring to FIGS. 6A and 6B, first pads P1 and first contact patterns 114 may be formed on the first openings OP1 and the second openings OP2, respectively.

In more detail, a first metal layer may be formed on the first light emitting parts LE1 formed with the first openings OP1 and the second openings OP2. The first metal layer may include at least one metallic material, such as Ni, Ag, Au, Pt, Ti, Al, Cr, W, TiW, Mo, Cu, or TiCu. By patterning the first metal layer, the first pads P1 may be formed on the first openings OP1 and the first contact patterns 114 may be formed on the second openings OP2. Each of the first transparent electrodes 108 may be applied with a positive voltage through each of the first pads P1. The first contact patterns 114 may be respectively bonded with second light emitting parts LE2 to be formed thereon, thereby electrically coupling the first light emitting parts LE1 and the second light emitting parts LE2.

Figure 7A:
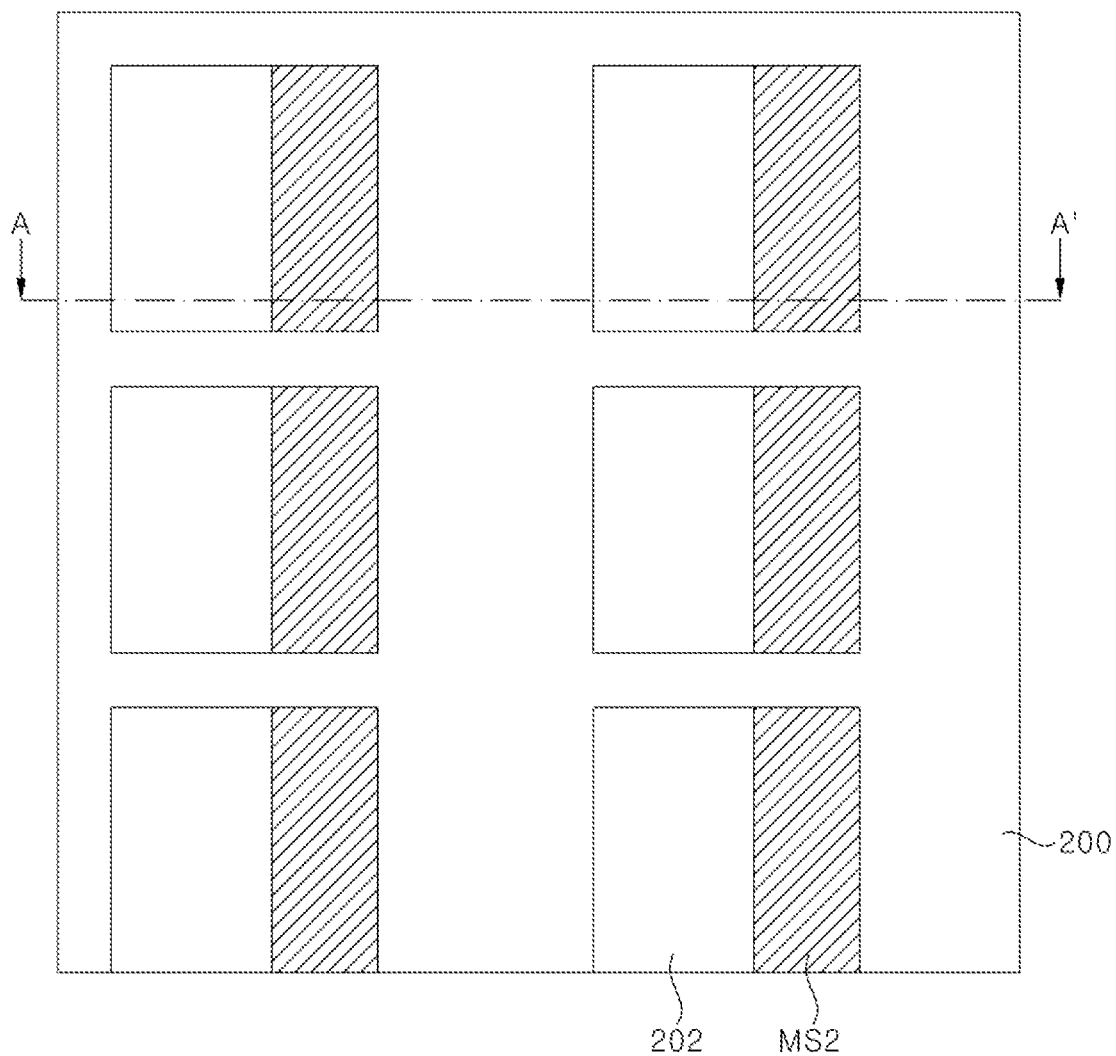
Figure 7B:
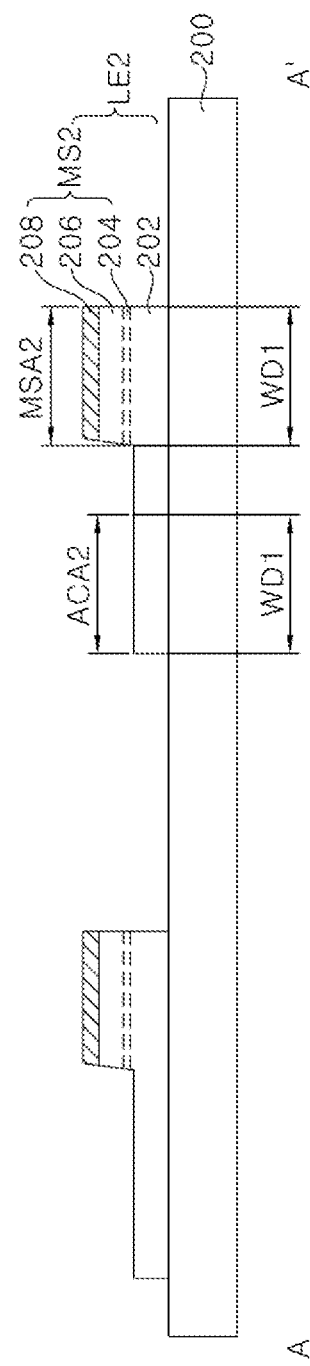

Referring to FIGS. 7A and 7B, a plurality of second light emitting parts LE2 may be formed on a second substrate 200.

In more detail, a second n-type semiconductor layer 202, a second active layer 204, a second p-type semiconductor layer 206, and a second transparent electrode 208 may be sequentially formed on the second substrate 200. By etching the second transparent electrode 208, the second p-type semiconductor layer 206, and the second active layer 204, second mesa structures MS2, in which the second active layer 204, the second p-type semiconductor layer 206, and the second transparent electrode 208 are vertically stacked may be formed on the second n-type semiconductor layer 202.

By etching the second n-type semiconductor layer 202, the second light emitting parts LE2 each including the second n-type semiconductor layer 202 and the second mesa structure MS2, which exposes a portion of the second n-type semiconductor layer 202, may be formed. The second light emitting part LE2 may include a second mesa area MSA2 where the second mesa structure MS2 is disposed, and a second bonding area ACA2 which is separated from the second mesa area MSA2 by a preset distance. The second mesa area MSA2 may have substantially the same first width WD1 as the first mesa area MSA1, and the second bonding area ACA2 may also have the first width WD1.

According to an exemplary embodiment, if the structure and the size of the second substrate 200 are substantially the same as those of the first substrate 100, each of the second light emitting parts LE2 may be formed on the second substrate 200 to correspond to the first bonding area ACA1 of each first light emitting part LE1 on the first substrate 100.

Figure 8A:
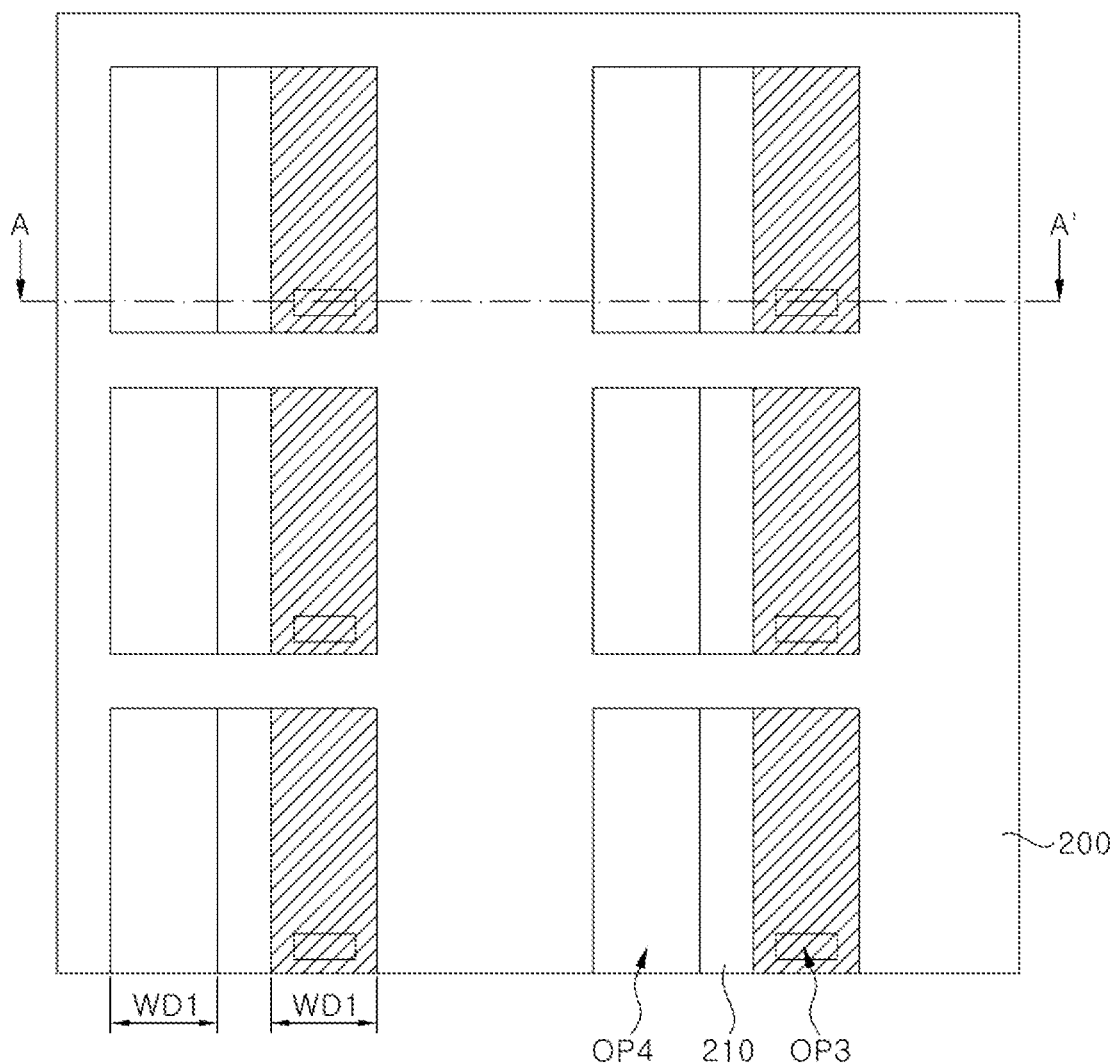
Figure 8B:
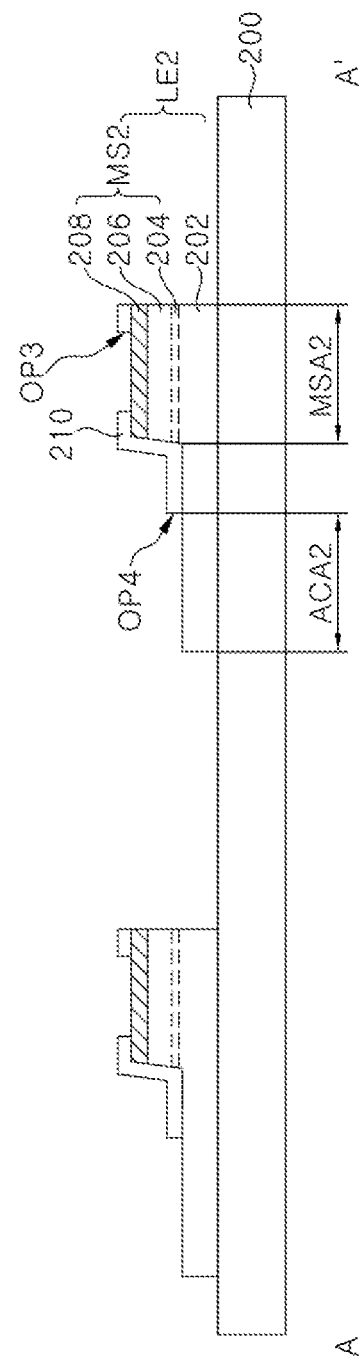

Referring to FIGS. 8A and 8B, a second insulation layer 210 may be formed on the second substrate 200, on which the second light emitting parts LE2 are formed. The second insulation layer 210 may include $SiO_2$, $SiN_x$, $Al_2O_3$, or others. By etching the second insulation layer 210, third openings OP3 exposing the second transparent electrodes 208 and fourth openings OP4 exposing the second bonding areas ACA2 may be formed.

Alternatively, rather than forming the third openings OP3 in the second insulation layer 210, which is disposed on the second transparent electrodes 208, a plurality of through holes may be formed. The plurality of through holes may be uniformly arranged.

Figure 9A:
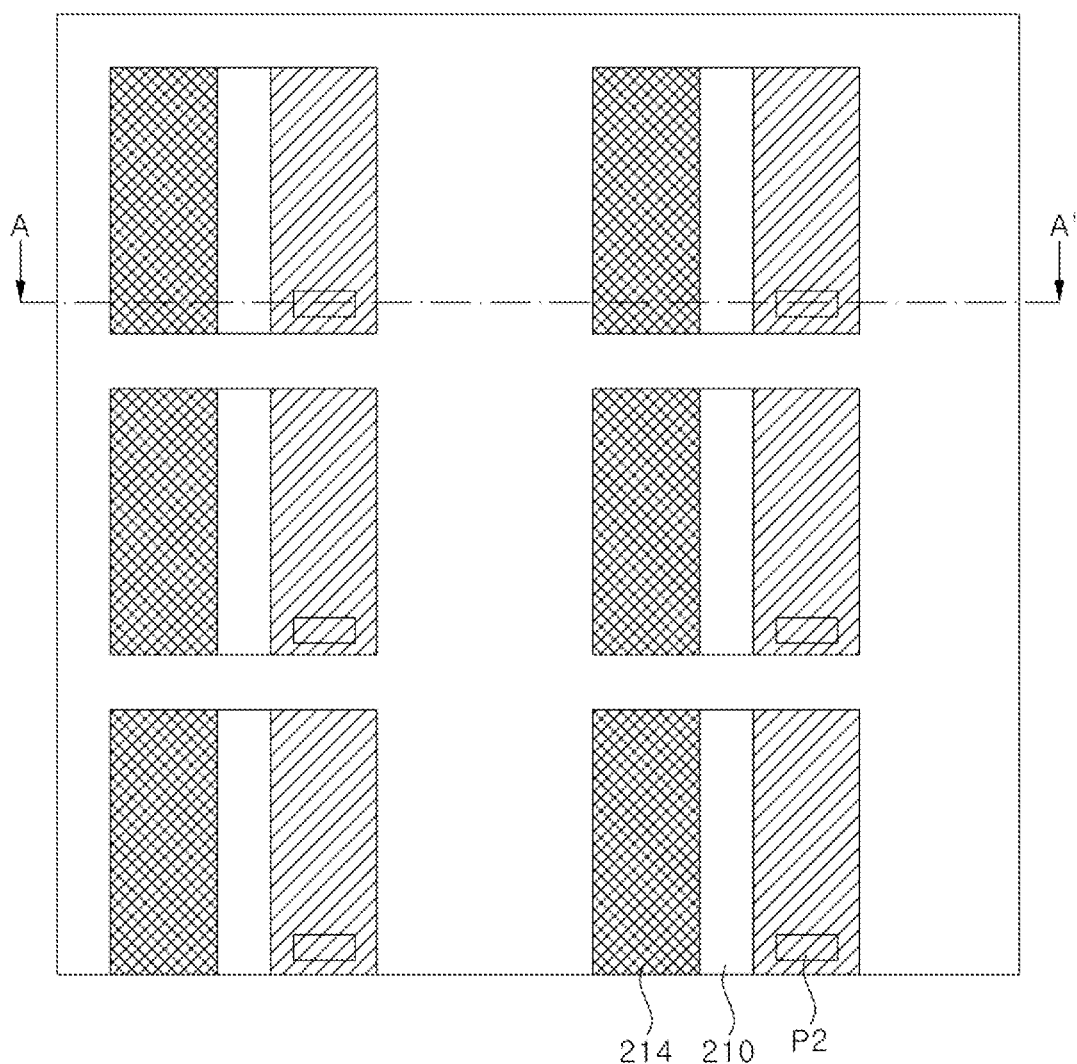
Figure 9B:
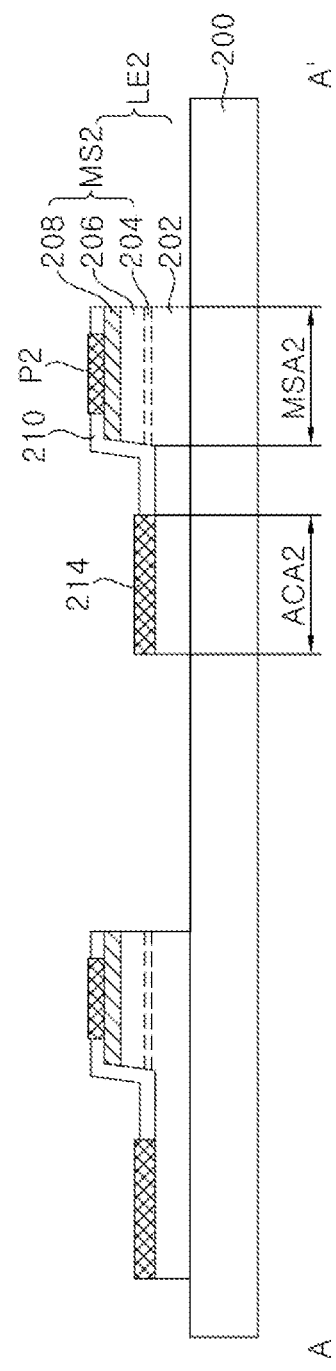

Referring to FIGS. 9A and 9B, second pads P2 and second contact patterns 214 may be formed on the third openings OP3 and the fourth openings OP4, respectively.

In more detail, a second metal layer may be formed on the second light emitting parts LE2, which are formed with the third openings OP3 and the fourth openings OP4. The second metal layer may include at least one metallic material, such as Ni, Ag, Au, Pt, Ti, Al, Cr, W, TiW, Mo, Cu, or TiCu. By patterning the second metal layer, the second pads P2 may be formed on the third openings OP3 and the second contact patterns 214 may be formed on the fourth openings OP4. Each of the second pads P2 may apply a positive voltage to each of the second transparent electrodes 208. The second contact patterns 214 may be respectively bonded with third light emitting parts LE3 to be formed thereon, thereby electrically coupling the second light emitting parts LE2 and the third light emitting parts LE3.

Figure 10A:
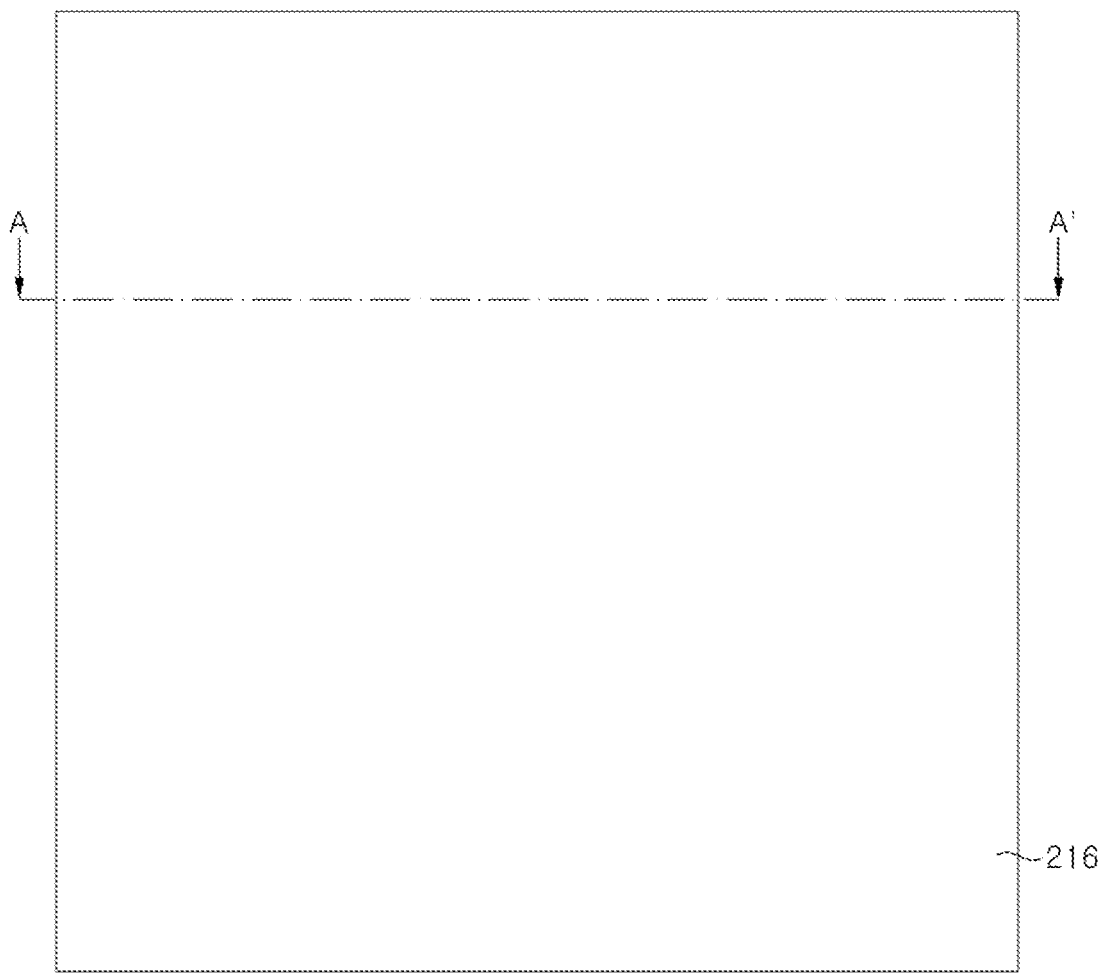
Figure 10B:
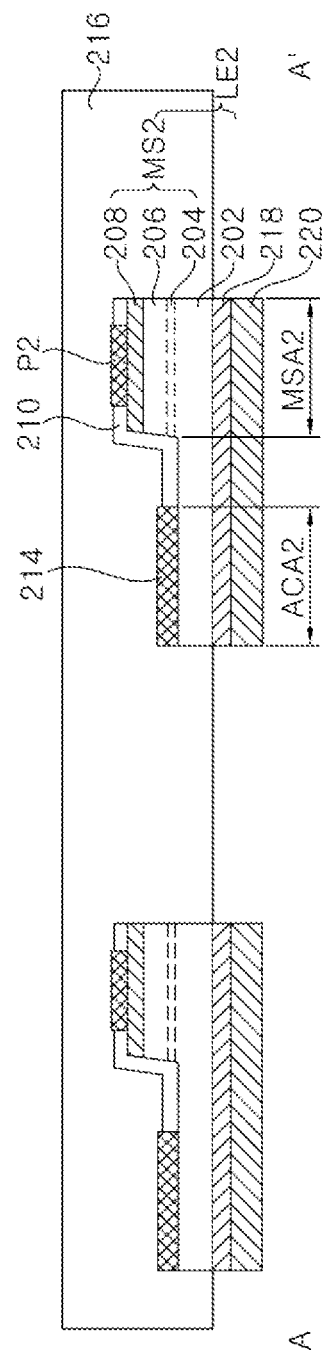

Referring to FIGS. 10A and 10B, a first removable carrier 216 may be attached onto the second light emitting parts LE2, which are formed with the second pads P2 and the second contact patterns 214. For example, the first carrier 216 may include one among a blue tape, a thermal release tape, a UV tape, a photoresist, or a wax. After attaching the first carrier 216, the second substrate 200 may be removed by using a laser lift-off process, or the like.

Then, third contact patterns 218 and first bonding patterns 220 may be sequentially formed on second n-type semiconductor layers 202, from which the second substrate 200 is removed. Each of the third contact patterns 218 may include Au. Each of the first bonding patterns 220 may include at least one of In, Sn, Ti, and Ni.

Figure 11A:
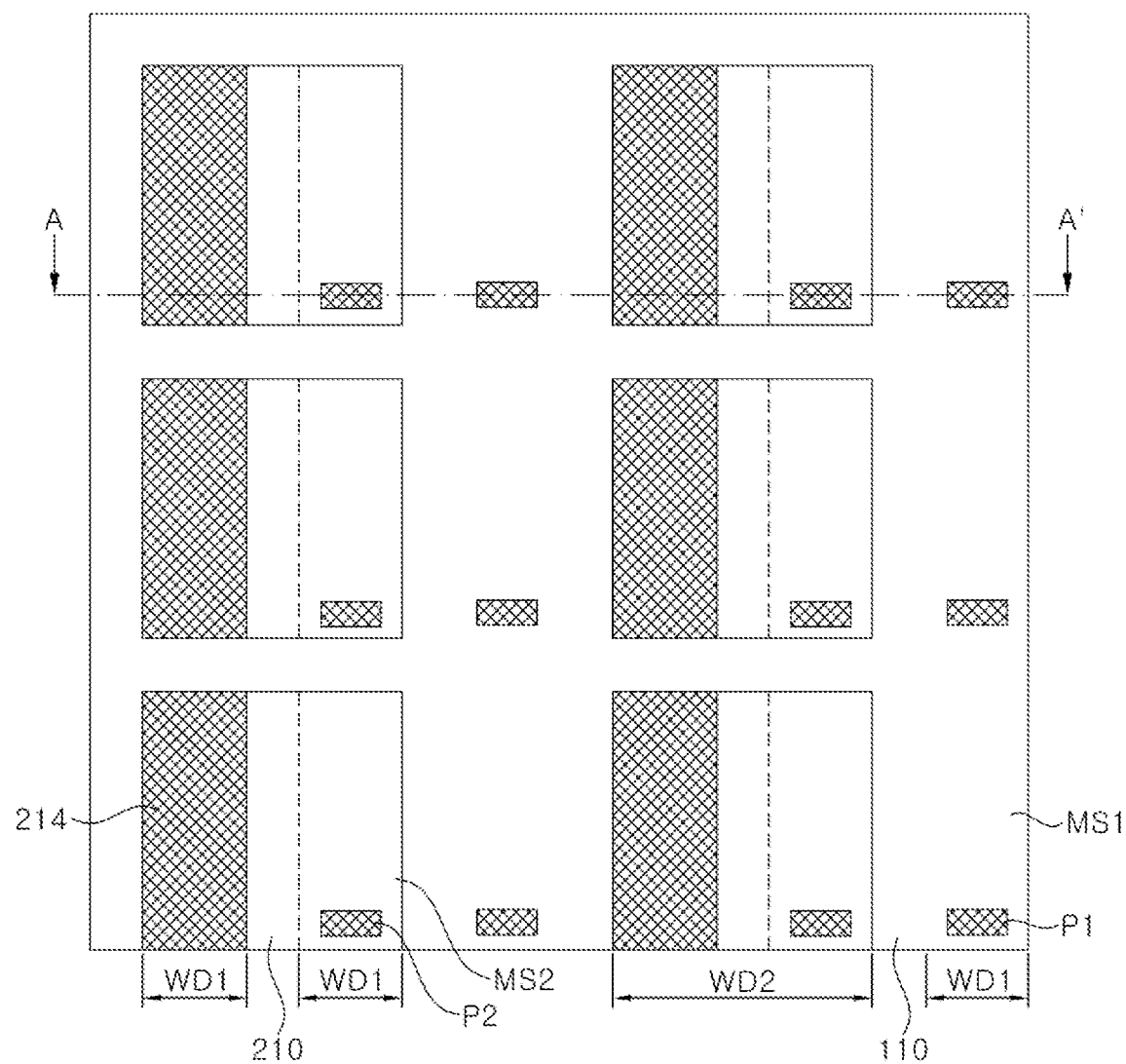
Figure 11B:
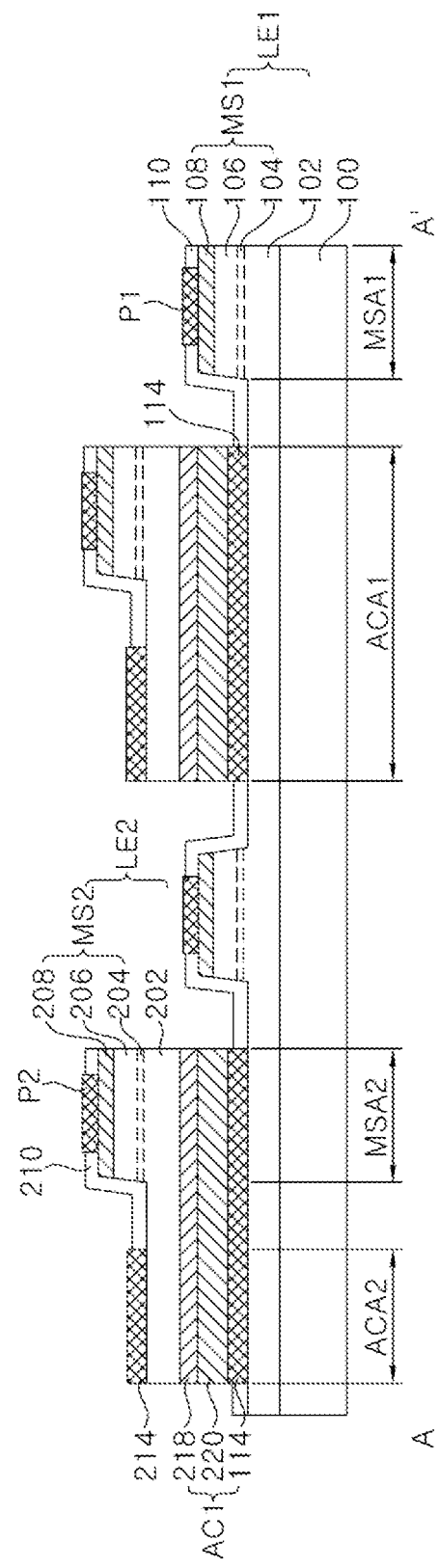

Referring to FIGS. 11A and 11B, the second light emitting parts LE2 may be respectively bonded onto the first light emitting parts LE1.

In more detail, by bonding the first contact patterns 114 of the first light emitting parts LE1 and the first bonding patterns 220 formed in the second light emitting parts LE2, a first bonding part AC1 including the first contact pattern 114, the first bonding pattern 220, and the third contact pattern 218 may be formed between each first light emitting part LE1 and each second light emitting part LE2. In this manner, the first bonding part AC1 may bond and electrically couple the first light emitting part LE1 and the second light emitting part LE2 to each other.

After electrically bonding the first light emitting parts LE1 and the second light emitting parts LE2, the first carrier 216 may be removed.

Figure 12A:
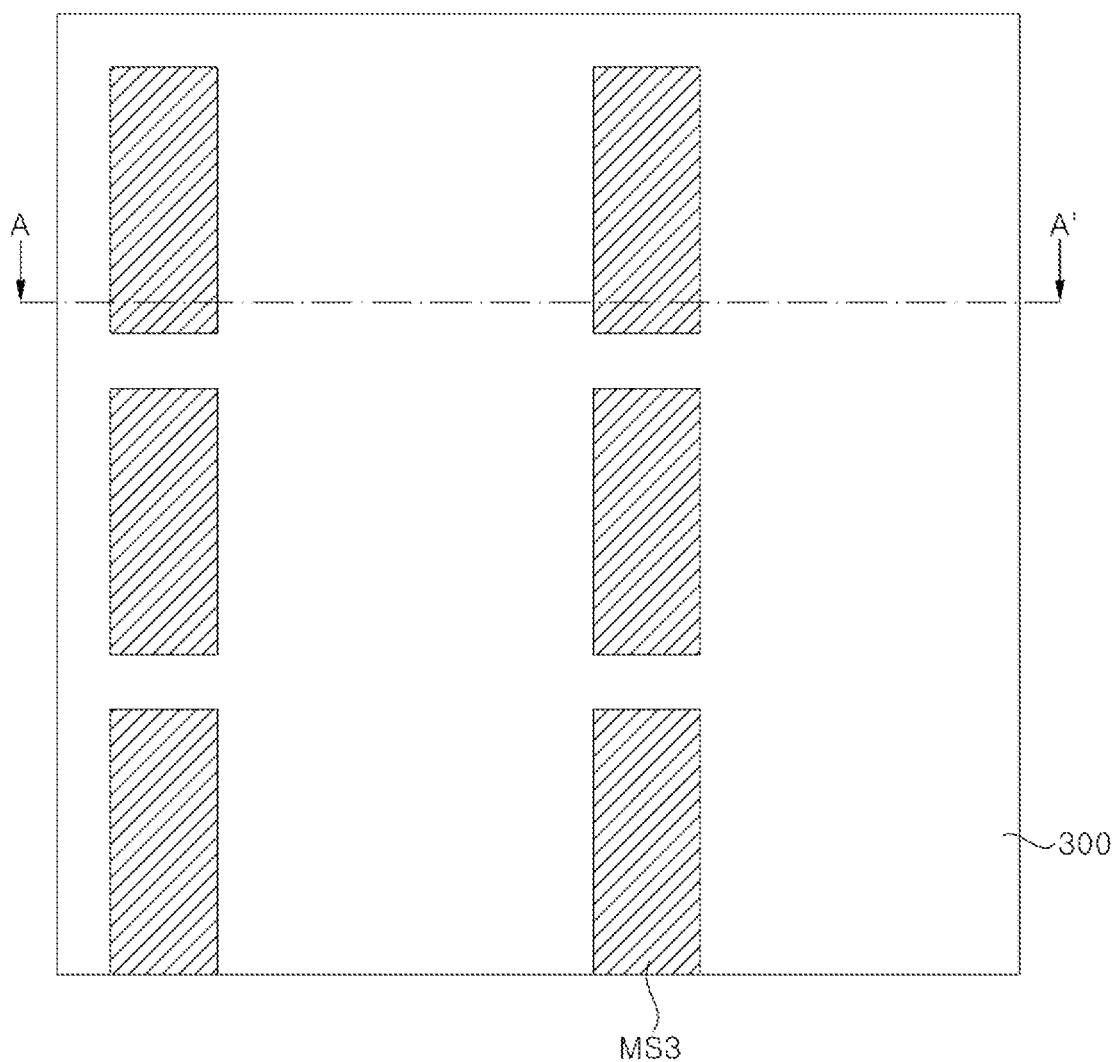
Figure 12B:
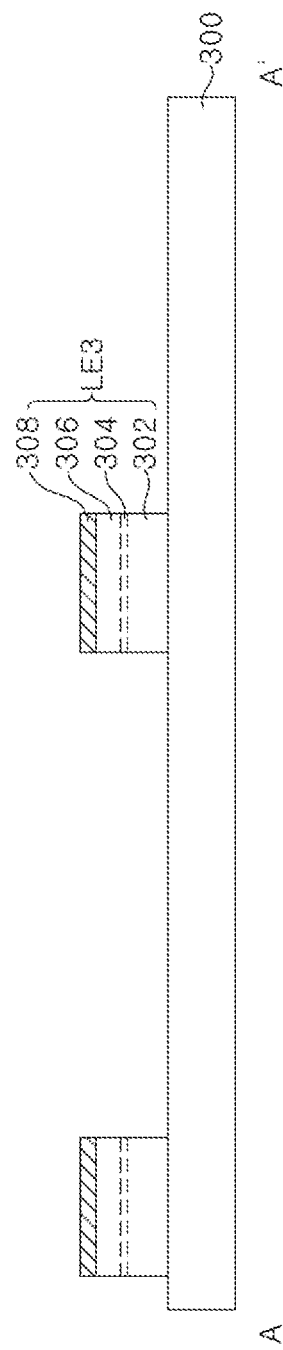

Referring to FIGS. 12A and 12B, a plurality of third light emitting parts LE3 may be formed on a third substrate 300.

In more detail, a third n-type semiconductor layer 302, a third active layer 304, a third p-type semiconductor layer 306, and a third transparent electrode 308 may be sequentially formed on the third substrate 300. By etching the third transparent electrode 308, the third p-type semiconductor layer 306, the third active layer 304, and the third n-type semiconductor layer 302, the third light emitting parts LE3 each including the third n-type semiconductor layer 302, the third active layer 304, the third p-type semiconductor layer 306, and the third transparent electrode 308, which are sequentially stacked one over another may be formed. Each of the third light emitting parts LE3 may have the first width WD1.

According to an exemplary embodiment, if the structure and the size of the third substrate 300 are substantially the same as those of each of the first substrate 100 and the second substrate 200, each of the third light emitting parts LE3 may be formed on the third substrate 300 to correspond to the second bonding area ACA2 of each second light emitting part LE2 on the second substrate 200.

Figure 13A:
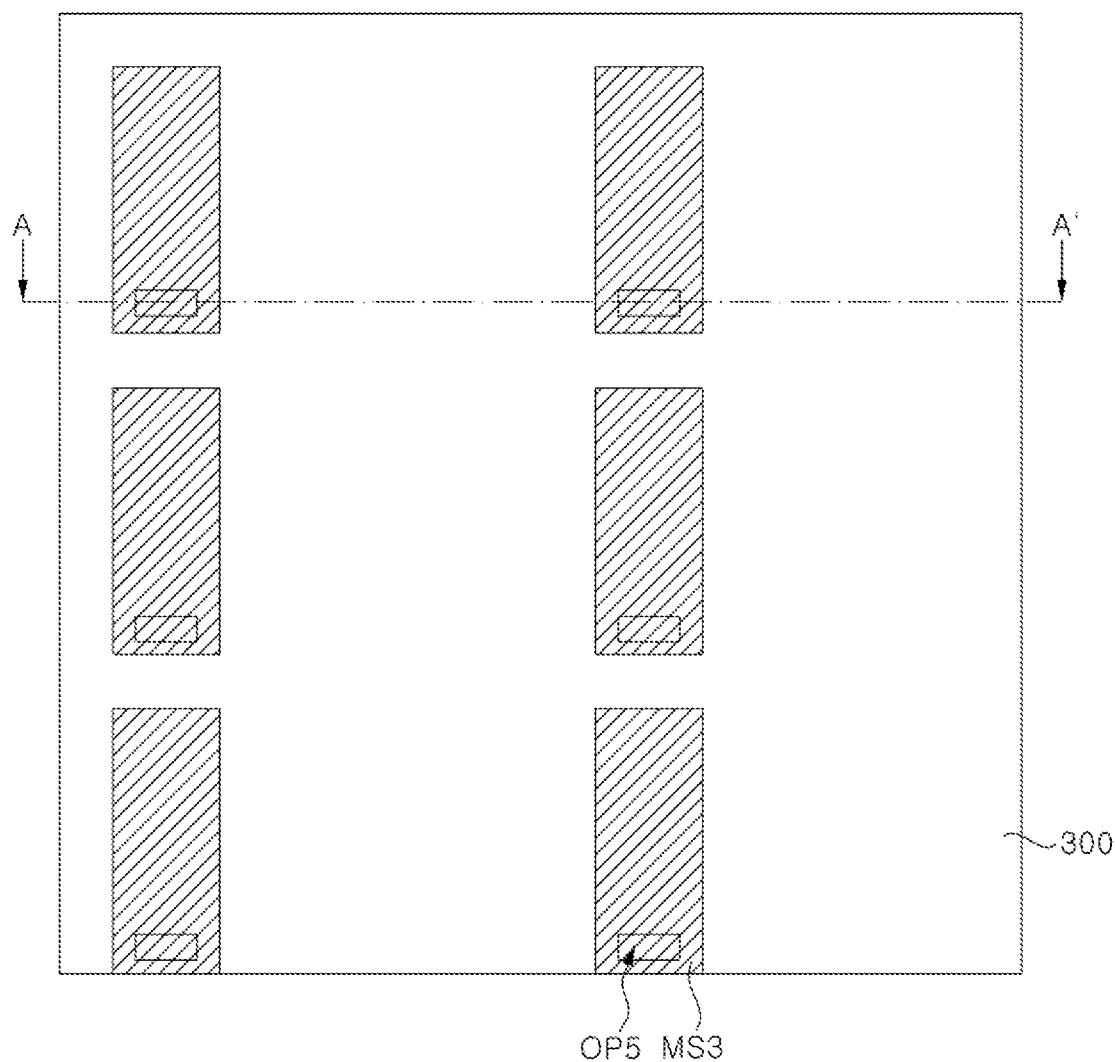
Figure 13B:
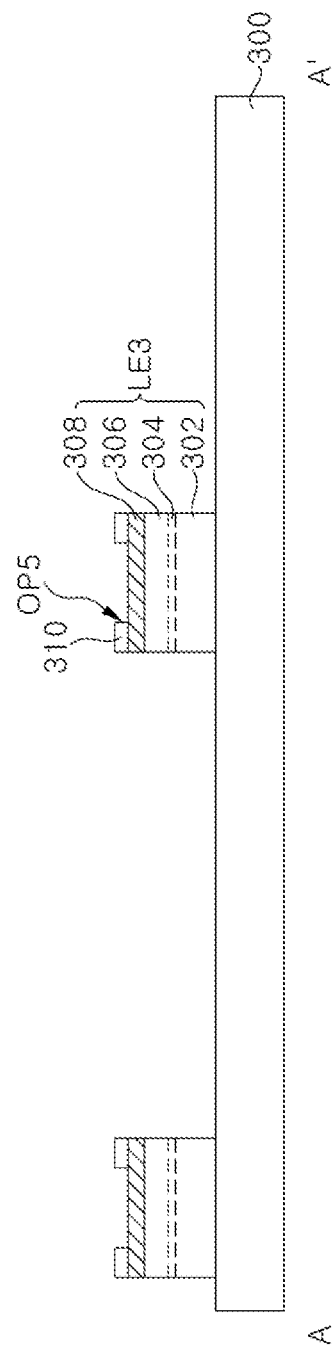

Referring to FIGS. 13A and 13B, a third insulation layer 310 may be formed on the third substrate 300, on which the third light emitting parts LE3 are formed. The third insulation layer 310 may include $SiO_2$, $SiN_x$, $Al_2O_3$, or others. By etching the third insulation layer 310, fifth openings OP5 exposing the third transparent electrodes 308 may be formed.

Alternatively, rather than forming the fifth openings OP5 in the third insulation layer 310, which is disposed on the third transparent electrodes 308, a plurality of through holes may be formed. The plurality of through holes may be uniformly arranged.

Figure 14A:
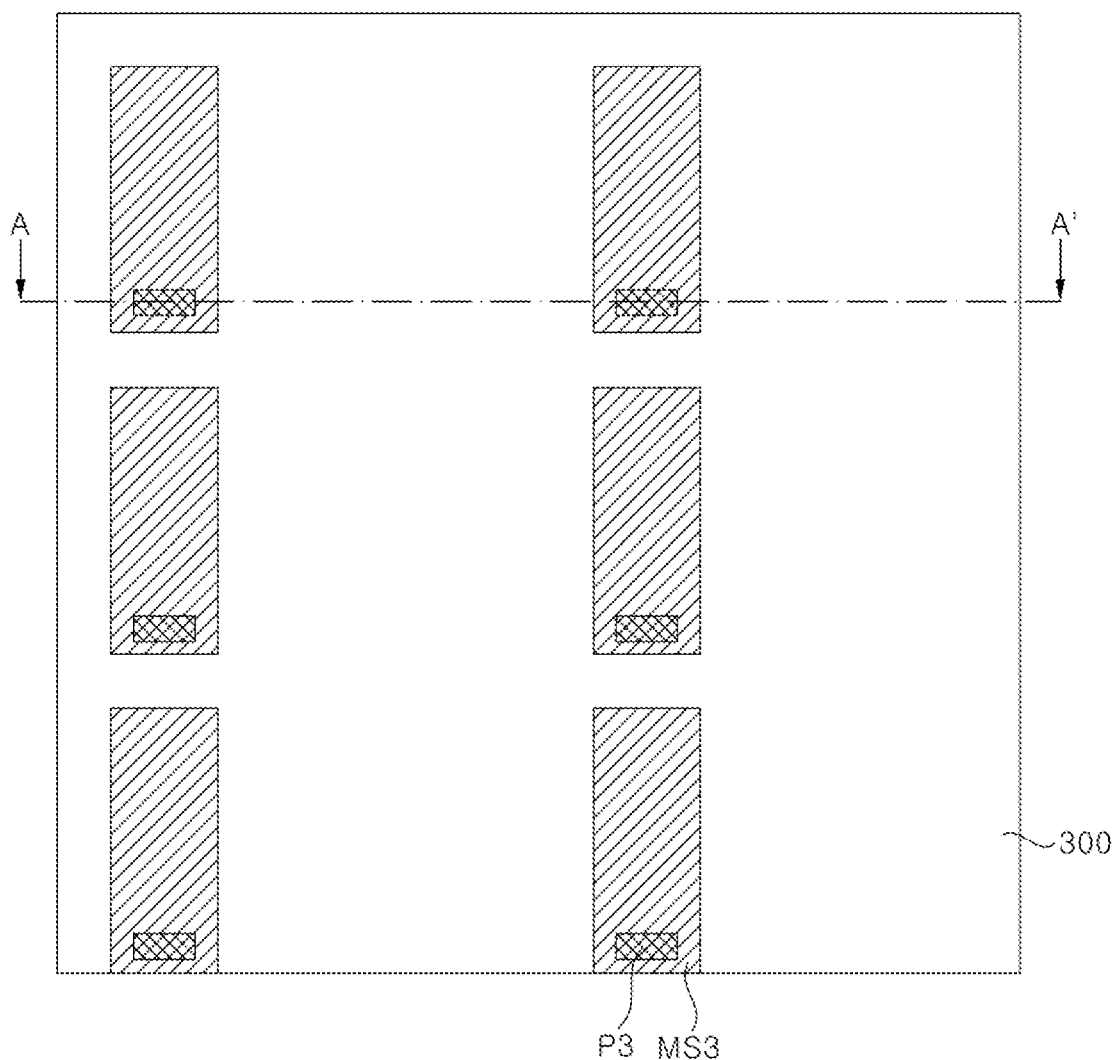
Figure 14B:
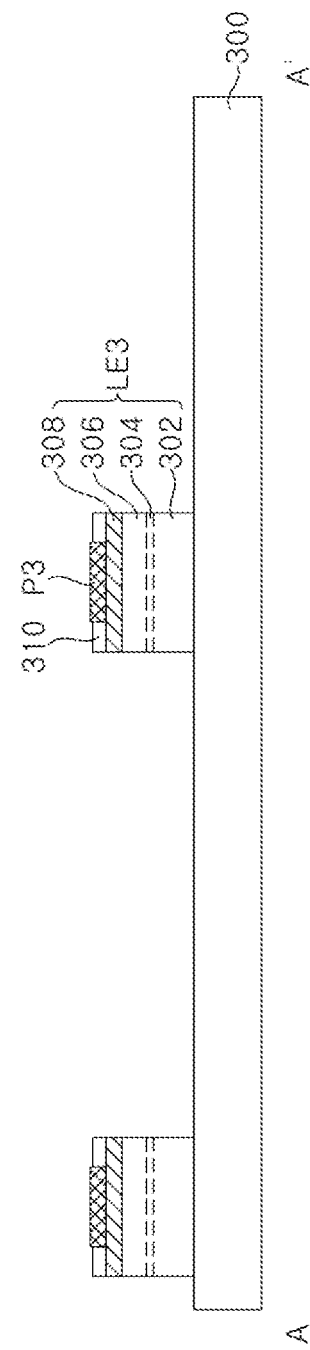

Referring to FIGS. 14A and 14B, third pads P3 may be formed on the fifth openings OP5. The third pads P3 may include at least one metallic material of Ni, Ag, Au, Pt, Ti, Al, Cr, W, TiW, Mo, Cu, or TiCu. The third pads P3 may apply a positive voltage to the third transparent electrodes 308.

Figure 15A:
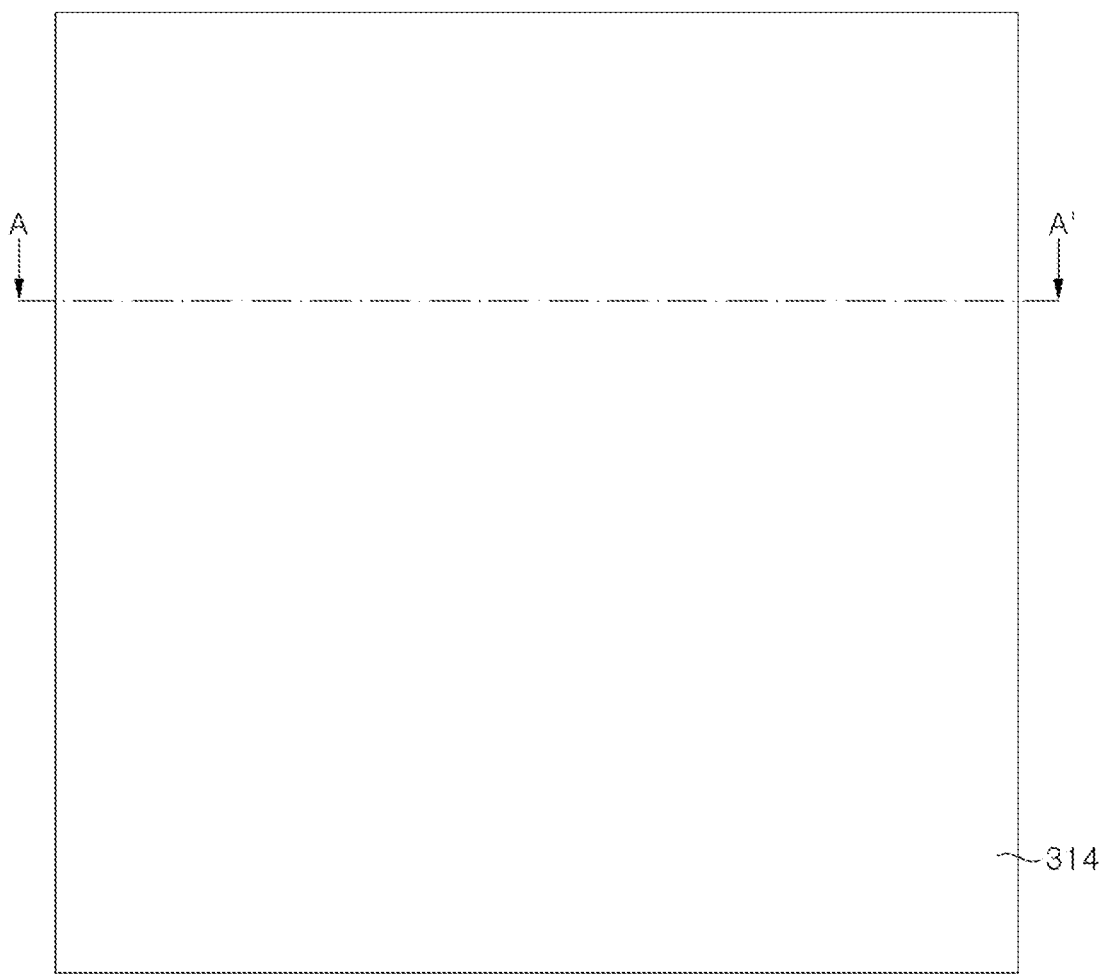
Figure 15B:
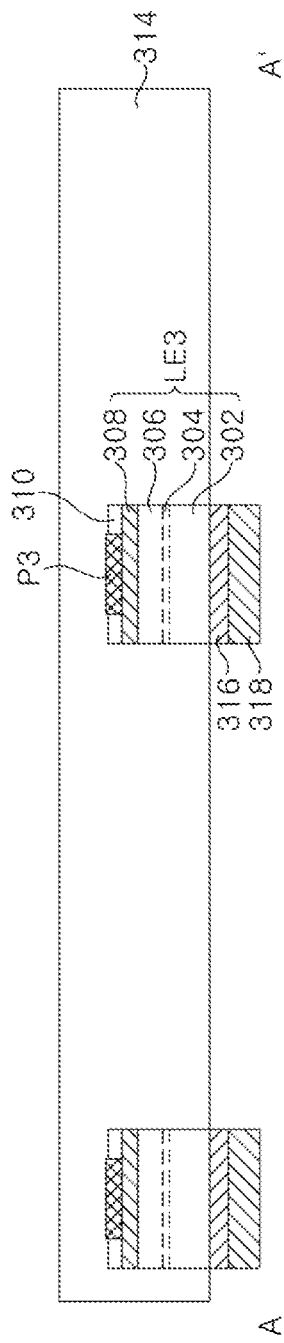

Referring to FIGS. 15A and 15B, a second removable carrier 314 may be attached onto the third light emitting parts LE3 formed with the third pads P3. For example, the second carrier 314 may include one among a blue tape, a thermal release tape, a UV tape, a photoresist, or a wax. After attaching the second carrier 314, the third substrate 300 may be removed by using a laser lift-off process, or the like.

Then, fourth contact patterns 316 and second bonding patterns 318 may be sequentially formed on third n-type semiconductor layers 302 from which the third substrate 300 is removed. Each of the fourth contact patterns 316 may include at least one of Ni, Ag, Au, Pt, Ti, Al, Cr, W, TiW, Mo, Cu, or TiCu. Each of the second bonding patterns 318 may include at least one of In, Sn, Ti and Ni.

Figure 16A:
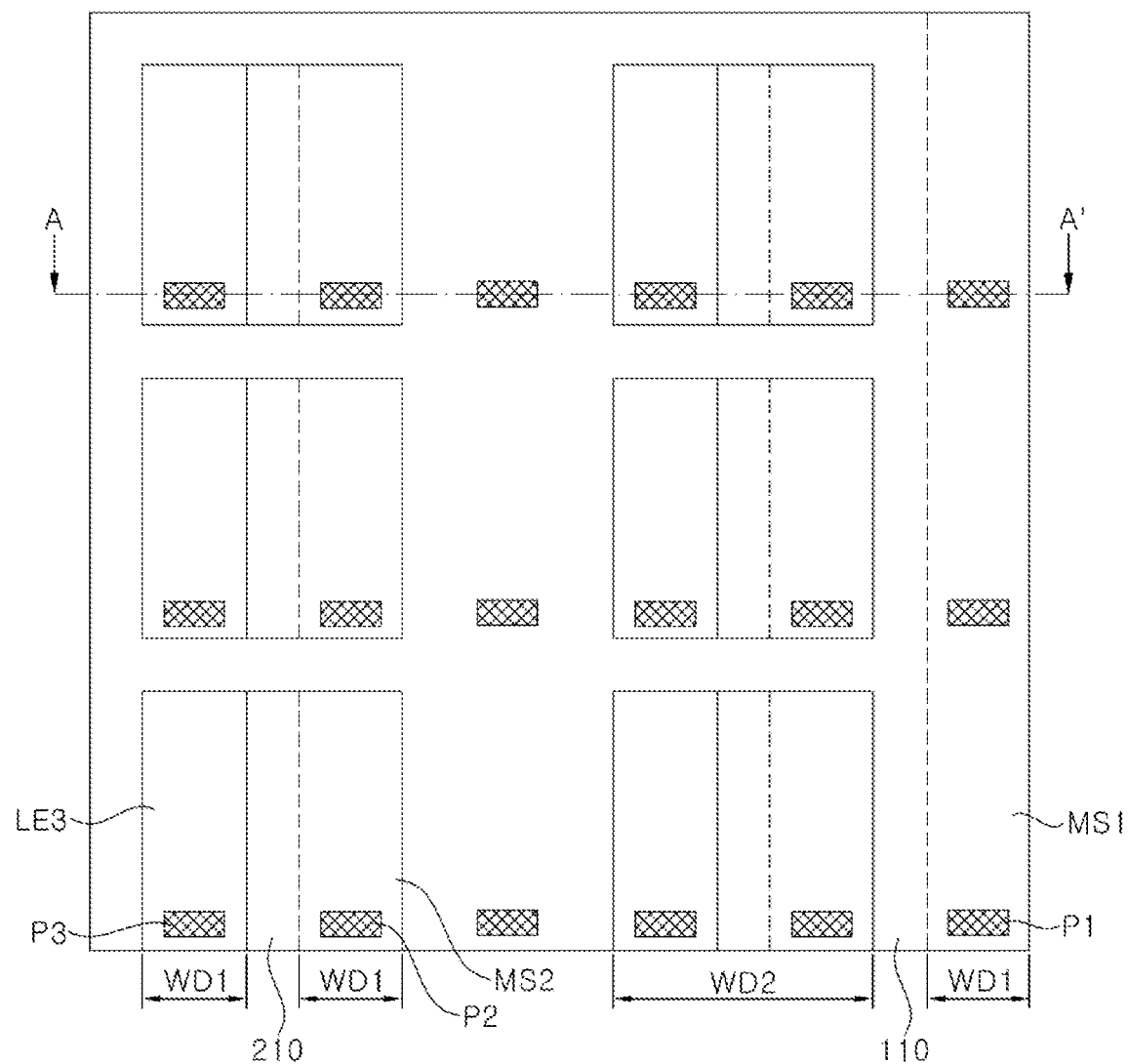
Figure 16B:
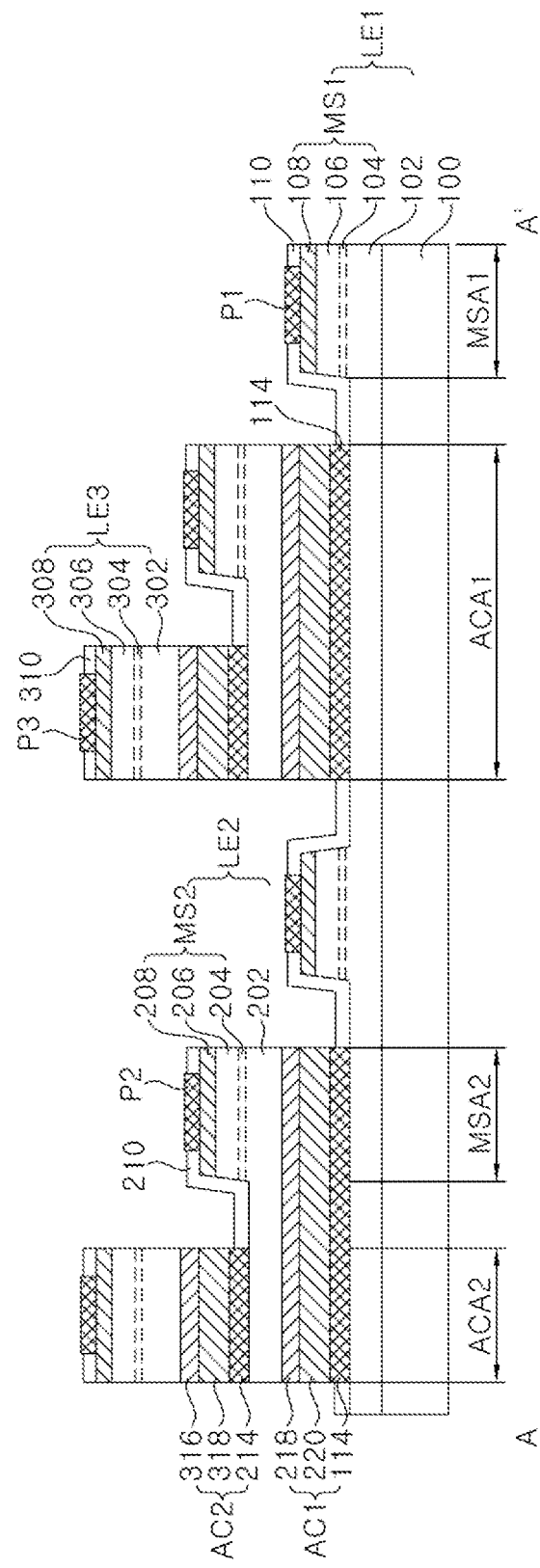

Referring to FIGS. 16A and 16B, the third light emitting parts LE3 may be respectively bonded onto the second light emitting parts LE2.

In more detail, by bonding the second contact patterns 214 of the second light emitting parts LE2 and the second bonding patterns 318 of the third light emitting parts LE3, a second bonding part AC2 including the second contact pattern 214, the second bonding pattern 318, and the fourth contact pattern 316 may be formed between each second light emitting part LE2 and each third light emitting part LE3. The second bonding part AC2 may bond and electrically couple the second light emitting part LE2 and the third light emitting part LE3 to each other.

After electrically bonding the second light emitting parts LE2 and the third light emitting parts LE3, the second carrier 314 may be removed.

Referring back to FIG. 1A, after removing the first substrate 100 by using a laser lift-off process, or the like, a common pad CP may be formed on the bottom surface of the first n-type semiconductor layer 102. The common pad CP may include at least one of Ni, Ag, Au, Pt, Ti, Al, Cr, W, TiW, Mo, Cu, TiCu, Sn, In, InSn, or AuSn.

According to the exemplary embodiments, the light emitting device may include a first light emitting layer, a second light emitting layer, and a third light emitting layer that are vertically stacked one over another, such that a first active layer, a second active layer, and a third active layer do not overlap with each other, and the sizes of the respective first to third active layers are substantially the same. As such, light generated from the respective first to third light emitting parts may not interfere with one another, thereby improving light reproducibility.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light emitting device comprising:
a first light emitter including a first n-type semiconductor layer, and a first mesa structure including a first active layer, a first p-type semiconductor layer, and a first transparent electrode vertically stacked one over another and exposing a portion of a first surface of the first n-type semiconductor layer;
a second light emitter spaced apart from the first mesa structure, and including a second n-type semiconductor layer, a second active layer, a second p-type semiconductor layer, and a second transparent electrode and exposing a portion of a first surface of the second n-type semiconductor layer; and
a first bonding layer on which the first and second light emitters are disposed and electrically coupling the first n-type semiconductor layer and the second n-type semiconductor layer to each other.

2. The light emitting device of claim 1, wherein the first light emitter is disposed on the exposed portion of the first surface of the second n-type semiconductor layer.

3. The light emitting device of claim 1, wherein the second light emitter includes a second mesa structure including a portion of the second n-type semiconductor layer, the second active layer, the second p-type semiconductor layer, and the second transparent electrode; and
the first mesa structure and the second mesa structure are laterally spaced apart from each other in a plan view.

4. The light emitting device of claim 3, further comprising a first bonding member disposed between the first light emitter and the second light emitter,
wherein a thickness of the first bonding member is greater than a thickness of the second mesa structure.

5. The light emitting device of claim 1, further comprising a third light emitter spaced apart from the second light emitter, and including a third n-type semiconductor layer, a third active layer, a third p-type semiconductor layer, and a third transparent electrode,
wherein the first, second, and third light emitters are configured to emit light having different peak wavelengths from each other.

6. The light emitting device of claim 5, wherein the third light emitter is disposed on the first bonding layer, and the third n-type semiconductor layer is electrically coupled to the first bonding layer.

7. The light emitting device of claim 5, further comprising a second bonding member disposed between the second light emitter and third light emitter,
wherein:
the third light emitter includes a third mesa structure including a portion of the third n-type semiconductor layer, the third active layer, the third p-type semiconductor layer, and the third transparent electrode; and
a thickness of the second bonding member is greater than a thickness of the third mesa structure.

8. The light emitting device of claim 7, wherein the first mesa structure and the third mesa structure are disposed on a different plane.

9. The light emitting device of claim 5, further including a light blocking layer disposed between the first and third light emitters, the light blocking layer having a thickness greater than a thickness of the first light emitter and the second light emitter.

10. The light emitting device according to claim 1, wherein the first transparent electrode and the second transparent electrode do not overlap each other.

11. A display device comprising:
a first light emitter including a first n-type semiconductor layer, and a first emitting structure including a first active layer, a first p-type semiconductor layer, and a first ohmic electrode vertically stacked one over another and exposing a portion of a first surface the first n-type semiconductor layer;
a second light emitter spaced apart from the first emitting structure, and including a second n-type semiconductor layer, a second active layer, a second p-type semiconductor layer, and a second ohmic electrode and exposing a portion of a first surface the second n-type semiconductor layer; and a first bonding layer on which the first light emitter and the second light emitter are disposed and electrically coupling the first n-type semiconductor layer and the second n-type semiconductor layer to each other.

12. The display device of claim 11, wherein the first light emitter is disposed on the exposed portion of the first surface of the second n-type semiconductor layer.

13. The display device of claim 11, further including a light blocking layer disposed between the first and second light emitters, the light blocking layer having a thickness greater than a thickness of the first light emitter.

14. The display device of claim 13, further comprising a first bonding member disposed between the first light emitter and the second light emitter,
wherein:
the second light emitter includes a second emitting structure including a portion of the second n-type semiconductor layer, the second active layer, the second p-type semiconductor layer, and the second ohmic electrode; and
a thickness of the first bonding member is greater than a thickness of the second emitting structure.

15. The display device of claim 11, wherein the first light emitter and the second light emitter are disposed on a different plane.

16. A display device comprising:
a first light emitter including a first n-type semiconductor layer, and a first emitting structure including a first active layer, a first p-type semiconductor layer, and a first ohmic electrode vertically stacked one over another and exposing a portion of a first surface the first n-type semiconductor layer;

a second light emitter spaced apart from the first emitting structure, and including a second n-type semiconductor layer, a second active layer, a second p-type semiconductor layer, and a second ohmic electrode and exposing a portion of a first surface the second n-type semiconductor layer; and a first bonding layer on which the first light emitter and the second light emitter are disposed and electrically coupling the first n-type semiconductor layer and the second n-type semiconductor layer to each other, wherein the first n-type semiconductor layer, the first active layer, and the first p-type semiconductor layer are interposed between the first ohmic electrode and the first bonding layer.

17. The display device of claim 16, wherein the first light emitter is disposed on the exposed portion of the first surface of the second n-type semiconductor layer.

18. The display device of claim 16, wherein the second n-type semiconductor layer, the second active layer, and the second p-type semiconductor layer are interposed between the second ohmic electrode and the first bonding layer.

19. The display device of claim 16, further including a light blocking layer disposed between the first and second light emitters, the light blocking layer having a thickness greater than a thickness of the first light emitter.

20. The display device of claim 16, wherein the first light emitter and the second light emitter are disposed on a different plane.

* * * * *